(12) United States Patent
Liu et al.

(10) Patent No.: US 6,905,921 B1
(45) Date of Patent: Jun. 14, 2005

(54) ADVANCED MOSFET DESIGN

(75) Inventors: Yowjuang (Bill) Liu, San Jose, CA (US); Francois Gregoire, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/800,259

(22) Filed: Mar. 11, 2004

Related U.S. Application Data

(62) Division of application No. 10/247,218, filed on Sep. 19, 2002, now abandoned.
(60) Provisional application No. 60/323,772, filed on Sep. 19, 2001.

(51) Int. Cl.$^7$ .......................................... H01L 21/336
(52) U.S. Cl. ...................................... 438/197; 257/408
(58) Field of Search ........................................ 438/197

(56) References Cited

U.S. PATENT DOCUMENTS

| | | | |
|---|---|---|---|
| 5,449,937 A | 9/1995 | Arimura et al. | 257/345 |
| 5,614,752 A | * 3/1997 | Takenaka | 257/408 |
| 5,920,104 A | 7/1999 | Nayak et al. | 257/408 |
| 6,081,010 A | 6/2000 | Sanchez | 257/345 |
| 6,147,377 A | 11/2000 | Liu | 257/314 |
| 6,147,383 A | 11/2000 | Kuroda | 257/344 |
| 6,258,683 B1 | 7/2001 | Besser et al. | 438/306 |
| 6,265,256 B1 | 7/2001 | An et al. | 438/201 |
| 6,285,054 B1 | 9/2001 | Liu et al. | 257/315 |
| 2001/0017390 A1 | 8/2001 | Long et al. | 257/368 |
| 2002/0011635 A1 | 1/2002 | Abe et al. | 257/408 |

OTHER PUBLICATIONS

Lee, W., Hwang, H., "Hot Carrier Degradation for Narrow Width MOSFET With Shallow Trench Isolation," Microelectronics Reliability, Received Jul. 13, 1999, Revised Sep. 22, 1999, 40 (2000), pp. 49–56.

* cited by examiner

*Primary Examiner*—David Nelms
*Assistant Examiner*—Thao P. Le
(74) *Attorney, Agent, or Firm*—Morgan, Lewis & Bockius LLP

(57) ABSTRACT

The present invention includes an advanced MOSFET design and manufacturing approach that allow further increase in IC packing density by appropriately addressing the increased leakage problems associated with it. The MOSFET according to one embodiment of the present invention includes a gate, source/drain diffusion regions on opposite sides of the gate, and source/drain extensions adjacent the source/drain diffusion regions. The MOSFET also includes at least one added corner diffusion region that overlaps with at least a portion of a source/drain extension region for reducing off-state leakage currents. The corner diffusions can be created using conventional CMOS IC fabrication processes with some modification of an ion implant mask used in manufacturing a conventional CMOS IC.

30 Claims, 18 Drawing Sheets

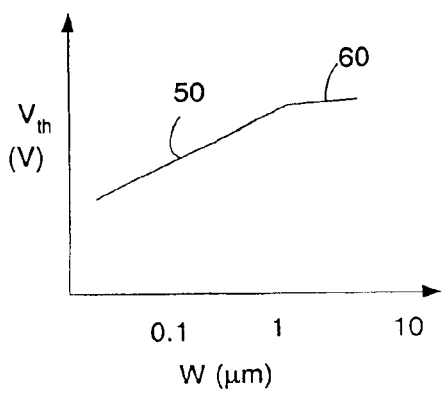
FIG. 2A
(Prior Art)
| $V_{th}$ (V) | | | | | | | | | |
|---|---|---|---|---|---|---|---|---|---|
| W | 10 | 5 | 1 | 0.8 | 0.6 | 0.4 | 0.3 | 0.2 | 0.18 | 0.15 |
| 0.15LV | 0.34 | 0.34 | 0.32 | 0.31 | 0.29 | 0.27 | 0.26 | 0.24 | 0.23 | |
| 0.13 | 0.35 | 0.35 | 0.35 | 0.35 | 0.35 | 0.34 | 0.315 | 0.28 | | 0.24 |
FIG. 2B
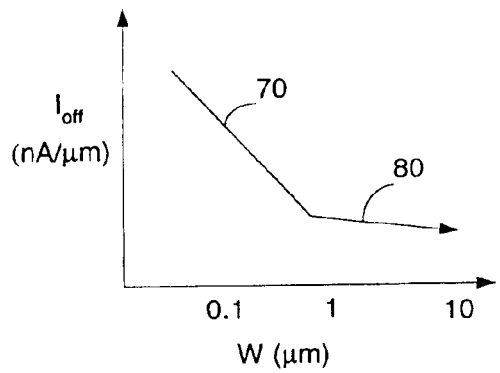
FIG. 2C
(Prior Art)
| $I_{offn}$ (nA/um) | | | | | | | | | |
|---|---|---|---|---|---|---|---|---|---|
| W | 10 | 5 | 1 | 0.8 | 0.6 | 0.4 | 0.3 | 0.2 | 0.18 | 0.15 |
| 0.15LV | 0.308 | 0.346 | 0.75 | 0.9125 | 1.2667 | 1.625 | 1.8667 | 2.9 | 3.5 | |
| 0.13μ | 0.259 | 0.268 | 0.32 | 0.3125 | 0.2833 | 0.45 | 0.7667 | 2.2 | | 6.6667 |
FIG. 2D

ADVANCED MOSFET DESIGN

CROSS-REFERENCE TO RELATED APPLICATIONS

The present application is a divisional and claims priority to application Ser. No. 10/247,218, filed Sep. 19, 2002, now abandoned which claims priority to the U.S. Provisional Application Ser. No. 60/323,772 filed Sep. 19, 2001.

FIELD OF THE INVENTION

The present invention relates to semiconductor devices, and more specifically to the design and manufacture of semiconductor devices, such as metal-oxide-semiconductor field effect transistors (MOSFETs).

BACKGROUND OF THE INVENTION

The performance, density, and cost of integrated circuit (IC) chips have been improving at a dramatic rate. Much of the improvement has been due to the ability to scale MOSFETs to increasingly smaller dimensions, resulting in higher speed and higher functional density. The increase in both clock frequency and transistor counts per chip also results in the increase in power dissipation per chip. Innovative solutions are needed to improve the performance of the MOSFETs in order to meet the requirements of overall circuit and device performance of the IC chip.

FIG. 1A illustrates a top-down view of a conventional MOSFET device 100 having a gate 110, a source 132 and a drain 135 in an active region 130 in a semiconductor substrate. Active region 130 may be bordered on some or all sides by isolation (or field) regions 160, which separate MOSFET 100 from other devices in an IC. The extent of gate 110 along the "y" direction shown in FIG. 1 is called the length L of the gate, while the extent of source 132, drain 135, or active region along the z direction is called the width W of the source, drain, or active region, respectively. Width W is also referred to as the width of MOSFET 100 and the width of gate 110.

FIG. 1B illustrates a cross-sectional view of MOSFET 100 along line B–B' in FIG. 1. As shown in FIG. 1B, gate 110 is separated from substrate 180 by a gate oxide layer 120. Source 132 and drain 135 are diffusion regions on two opposite sides of gate 110 and are formed in a well region 170 in substrate 180. Source 132, drain 135, and well 170 are typically formed by introducing dopants in corresponding regions in substrate 180 using a doping process. A typical doping process includes one or more ion implantation steps, in which dopant ions are implanted into selected areas of substrate 180, and a subsequent diffusion step, in which the substrate is subjected to thermal treatment, allowing the implanted dopants to diffuse and settle into corresponding regions of the substrate. Source 132 and drain 135 are typically doped with dopants having a conductivity type that is the opposite of that of the dopants in well 170. For example, if well 170 is doped with p-type dopants, the source and drain are formed with n-type dopants, or vice versa. Also, dopant concentrations in source and drain regions 132 and 135 are typically much heavier than that in well 170. MOSFETs having n-type source and drain are known as NMOSFETs and MOSFETs having p-type source and drain are known as PMOSFETs.

As shown in FIG. 1B, MOSFET 100 further includes source/drain extensions 142 and 145, which are diffusion regions also formed in well region 170 and which are shallower than source and drain regions 132 and 135. Souce/drain extensions 142 and 145 are typically formed by doping the corresponding regions of substrate 180 with dopants having the same conductivity type as the dopants in the source and drain regions 132 and 135. Dopant concentrations in source/drain extensions 142 and 145 are typically lighter than those in source and drain regions 132 and 135 but heavier than those in well 170. MOSFET 100 further comprises spacers 152 and 155 located on the sidewalls of gate 110. Spacers 152 and 155 are typically made of dielectric materials which further isolate the gate from the source and drain to prevent the build-up of device capacitance.

Isolation regions 160 may be formed using conventional shallow trench isolation (STI) techniques. The STI regions 160 are usually formed early in a process for fabricating MOSFET 100 by etching shallow trenches (typically less than 0.5 μm deep) into substrate 180, filling the trenches with a dielectric material, such as silicon dioxide (oxide), and then planarizing the deposited oxide with chemical mechanical polishing.

MOSFET 100 behaves like a switch. When a sufficient threshold voltage, $V_t$, is applied to the gate, a conductive channel 118 is formed in the part of the substrate immediately under gate oxide 120 and between the two source/drain extensions 142 and 145. The device is then turned "on" and relatively large currents can flow between the source and drain through channel 118. The distance that charge carriers travel between the source/drain extensions 142 and 145 is referred to as the effective length, $L_{eff}$, of the MOSFET.

Ideally, when MOSFET 100 is "off", i.e., when the voltage applied to the gate is lower than $V_t$, there is no current flow. In practice, however, the device is usually characterized by a small amount of unwanted leakage current $I_{off}$, which flows or "leaks" between any pair of source, drain and gate in an off-state of the device. The on/off ratios ($I_{on}/I_{off}$) of MOSFET 100 are common figures of merit and benchmark for transistor performance comparisons, where $I_{on}$ is the current that flows between the source and drain when a maximum logic voltage, typically called $V_{DD}$ or $V_{CC}$, is applied to both the gate and the drain while the source is grounded. Since leakage currents cause unnecessary heat generation and can cause problems related to the dissipation of excess heat, higher $I_{off}$ values or lower on/off ratios indicate degraded transistor performance.

As MOSFET devices become smaller, problems due to off-state leakage currents become more serious. There are several causes of off-state leakage currents, some of which are particularly related to device scaling, such as the so-called edge (or corner) leakage associated with the STI technology for forming isolation regions 160. STI is the technology of choice for complimentary metal-oxide-silicon (CMOS) ultra large scale integrated circuits (ULSI) when the gate length of MOSFETs shrink below the quarter micron regime. It is replacing the older isolation technologies, such as local oxidation of silicon (LOCOS), because it provides planarized active and field regions and it avoids the "bird's beak" associated with LOCOS, which extends beyond the mask-defined limit of the isolation regions and encroaches into the active region of a MOSFET. The planarized surfaces of STI are critical to meet the tighter lithography requirements associated with the fabrication of smaller devices, and the absence of the bird's beak improves the packing density and is helpful in scaling to smaller design rules.

The STI technology, however, also introduces new problems with leakage currents. A common STI leakage problem is called edge (or corner leakage), which occurs if the STI trench sidewall edges (or STI corners) 165 are too sharp. FIG. 1C is a cross-sectional view of MOSFET 100 along line C–C' in FIG. 1. The STI corners 165 can lead to a high fringing electric field, which may create inversion in the part of substrate 180 near STI corners 165 and thus parasitic transistors with a lower threshold voltage in the edge parts 102 and 103 of the MOSFET in parallel to the normal transistor in the middle part 101 of the MOSFET. This is especially a problem in circuits which operate with dual voltages and in embedded flash processes, since transistors there can have different thicknesses of gate oxides. While further rounding of the STI corners 165 may help alleviate the problem, reducing STI corner sharpness often requires substantial process modifications and additional process steps, resulting in increased manufacturing cost and lower manufacturing efficiency.

The edge (or corner) leakage may also occur when electrons or negatively charged ions get trapped along STI trench sidewalls 162 during the process for forming the STI 160. If the MOSFET 100 is a NMOSFET, in which the region under gate 110 is doped with p-type dopants, the trapped electrons or negatively charged ions at the trench sidewall 162 may diffuse into the surrounding regions, causing the part of well 170 near the trench sidewall 162 to have a lower dopant concentration. The lower dopant concentration between the source and drain regions means a lower threshold voltage so that the corresponding part of the NMOSFET can turn on when the voltage applied to gate 110 is lower than $V_t$, resulting in the so-called side-wall leakage current flowing between the source and drain. While field implants may be used in the device to reduce the sidewall leakage, a higher field implant dose results in larger capacitance and degraded device performance.

Still another problem associated with STI is the so-called inverse narrow width effect (INWE). As shown in FIG. 1C, the STI profile includes divots 167 that occur during the process for forming the STI as part of the effort to round the STI corners 165. The divots are a primary cause of the INWE, which is a parasitic phenomenon of lower effective threshold voltage as the width W of the MOSFET 100 becomes smaller. The effect of INWE can be seen from the plots of FIGS. 2A–2D. FIG. 2A plots the relationship between device width and the device threshold voltage, $V_{th}$. For device widths, W, well above 1 μm, segment 60 indicates that the threshold voltage remains relatively steady with changes in device width. However, when device width drops below about 1 μm, as depicted by segment 50, the threshold voltage of the device decreases at a much greater rate as the device width decreases. Representative values for the graph of FIG. 2A are provided in FIG. 2B.

Leakage currents can also occur due to the INWE because the presence of a lower threshold voltage, $V_t$, produces higher off-state leakage currents. FIG. 2C plots the relationship between device width and the device off-state current, $I_{off}$. As depicted in FIG. 2C, For widths well above 1 μm, $I_{off}$ remains relatively steady with changes in the device width as indicated by segment 80. However, as device width drops below about 1 μm as indicated by segment 70, $I_{off}$ increases with reduced device width at a much greater rate. Representative values for the graph of FIG. 2C are provided in FIG. 2D.

Another cause for off-state leakage currents is related to effective gate oxide thinning, which occurs over a device lifetime due to imperfections in the gate oxide layer 120 and stresses on the device such as high applied voltage levels. The effective thinning of the gate oxide film 120 increases the likelihood of oxide breakdown caused by the well-known "hot-carrier effect" which is more prominent at the drain side of edges 102 and 103 of MOSFET 100 near gate 110 (FIG. 1C).

In short, leakage currents can come from many different sources, and $I_{off}$ test failures represent a major source of device failures and considerable economic waste. Therefore there is a need for an improved MOSFET design and fabrication approach that can alleviate the problems of leakage currents associated with manufacturing defects and device degradation without adversely affecting the electrical output characteristics of the device.

SUMMARY OF THE INVENTION

The present invention includes an advanced MOSFET design and manufacturing approach that allows further increase in IC packing density by appropriately addressing the increased leakage problems associated with it. According to one embodiment of the present invention, the MOSFET includes a gate that extends between opposite sides of the MOSFET, source/drain diffusion regions on opposite sides of the gate, and source/drain extensions adjacent the source/drain diffusion regions. The MOSFET also includes at least one corner diffusion region for reducing off-state leakage currents. The corner diffusion region overlaps with at least portions of the source/drain extension region adjacent the drain diffusion region near the sides of the MOSFET. All of the diffusion regions in the MOSFET of the present invention can be formed during a conventional CMOS IC fabrication process that fabricates NMOSFETs and PMOSFETs on a same substrate, with some modification of an ion implant mask used in the conventional CMOS IC fabrication process. The modified ion implant mask exposes at least portions of the active area of the MOSFET so that additional dopants may be implanted in the MOSFET to form the corner diffusion regions.

In addition to the reduction in leakage current, the MOSFET of the present invention also has reduced INWE and improved reliability because the added corner diffusion regions help to offset some of the manufacturing defects typically experienced by prior art MOSFETs. Also, compared with prior approaches to reduce MOSFET leakage, the present invention is more advantageous because it does not require extra processing steps in addition to those already used to fabricate a conventional CMOS IC. Avoidance of additional processing steps signifies improved yield and reduced manufacturing cost.

BRIEF DESCRIPTION OF THE DRAWINGS

For a more complete understanding of the present invention and advantages thereof, reference is now made to the following description taken in conjunction with the accompanying drawings, in which

FIGS. 2A–2D include plots and data tables illustrating the INWE of the conventional MOSFET device;

DETAILED DESCRIPTION OF THE INVENTION

Figure 3A:
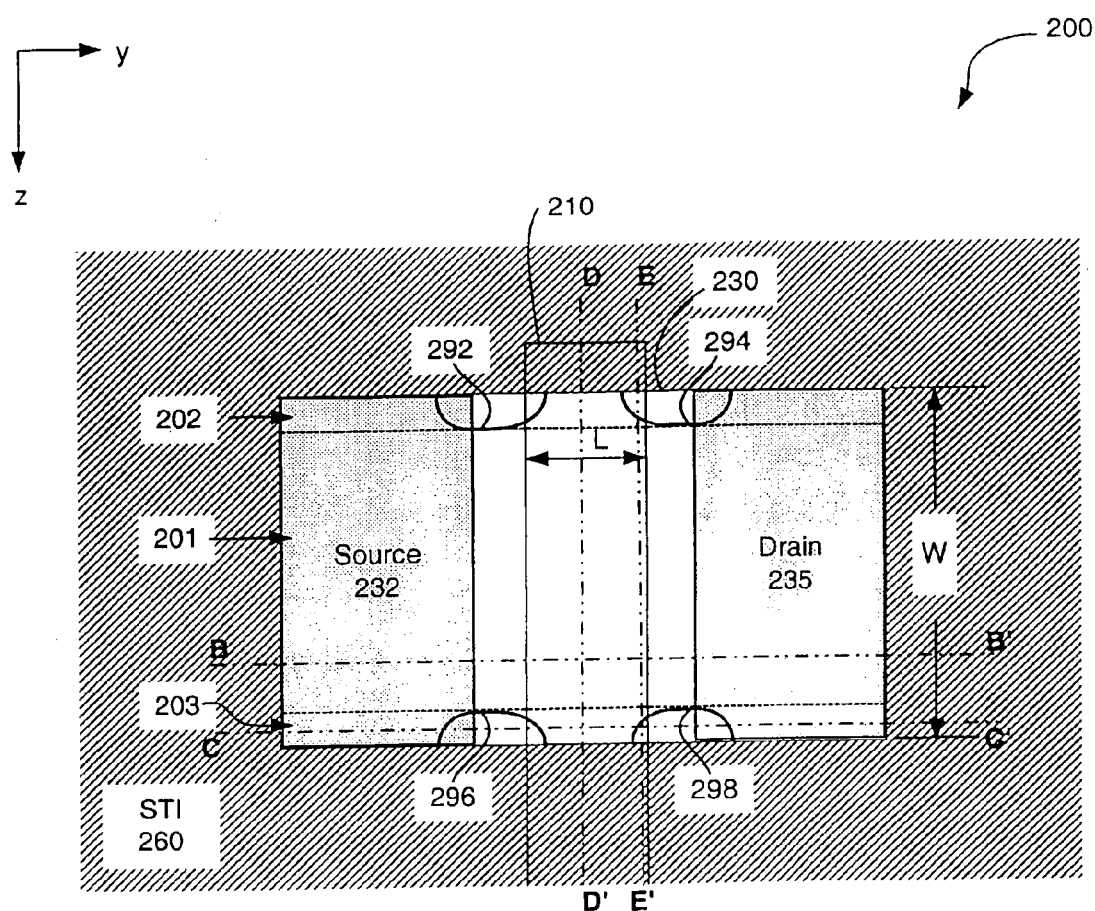
FIGS. 3A–3E are block diagrams illustrating top-down and cross-sectional views of a MOSFET device according to one embodiment of the present invention.

FIG. 3A illustrates a top-down view of a MOSFET device 200 according to one embodiment of the present invention. MOSFET 200 comprises a gate 210, a source 232 and a drain 235 in an active region 230 in a semiconductor substrate. Active region 230 may be bordered on some or all sides by isolation (or field) regions 260 formed using conventional shallow trench isolation (STI) techniques. STI regions 260 separate MOSFET 200 from other devices in an IC. The extent of gate 210 along the "y" direction shown in the FIG. 3A is called the length L of the gate, while the extent of source 232, drain 235, or active region along the z direction is called the width W of the source, drain, or active region, respectively. Width W is also referred to as the width of MOSFET 200 and the width of gate 210. Also shown along an upper edge and lower edge of the active region 230 as depicted in FIG. 3A are first and second edge or side parts 202 and 203, respectively, of the MOSFET 200. The edge parts 202 and 203 are separated by a middle or main part 201 of MOSFET 200.

Figure 3B:
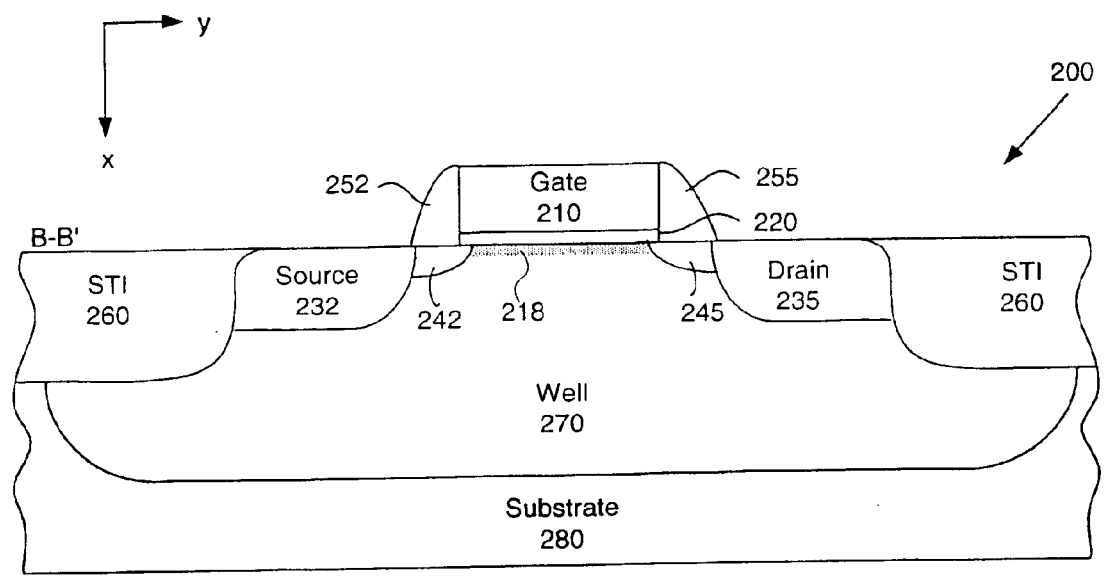

FIG. 3B illustrates a cross-sectional view of MOSFET 200 along line B–B' in FIG. 3A, which extends along the "y" direction and across a middle part 201 of MOSFET 200. As shown in FIG. 3B, the cross-sectional view of the middle part of MOSFET 200 is similar to that of MOSFET 100. Gate 210 is separated from active region 230 in substrate 280 by a gate dielectric layer 220. Source 232 and drain 235 are diffusion regions formed in a well region 270, which is in turn a diffusion region formed in substrate 280. Source 232, drain 235, and well 270 are typically formed by introducing dopants in corresponding regions in substrate 280 using a conventional doping process. Source 232 and drain 235 are doped with dopants having a conductivity type that is the opposite of that of the dopants in well 270. Also, dopant concentrations in source and drain regions 232 and 235 are typically much heavier than those in well 270. Depending on the types of dopants used to dope the source, drain and well of MOSFET 200, MOSFET 200 can be a NMOSFET or a PMOSFET.

As shown in FIG. 3B, MOSFET 200 further includes source/drain extensions 242 and 245 adjacent source and drain regions 232 and 235, respectively. Source/drain extensions 242 and 245 are diffusion regions that are shallower than source and drain regions 232 and 235, and that are formed in well region 270 by doping the corresponding regions with dopants having the same conductivity type as those in the source and drain regions 232 and 235. Dopant concentrations in source/drain extensions 242 and 245 are typically much lighter than those in source and drain regions 232 and 235 but much heavier than those in well 270.

MOSFET 200 further comprises spacers 252 and 255 located on the sidewalls of gate 210. Spacers 252 and 255 are typically made of dielectric materials and further isolate gate 210 from the source and drain 232 and 235 to prevent the build-up of device capacitance.

Like conventional MOSFET 100, MOSFET 200 also behaves like a switch. When a sufficient threshold voltage, $V_t$, is applied to gate 220, a conductive channel 218 is formed in the part of the substrate immediately under gate dielectric 220 and between the two source/drain extensions 242 and 245, so that current can flow through the channel between the source and drain.

Figure 3C:
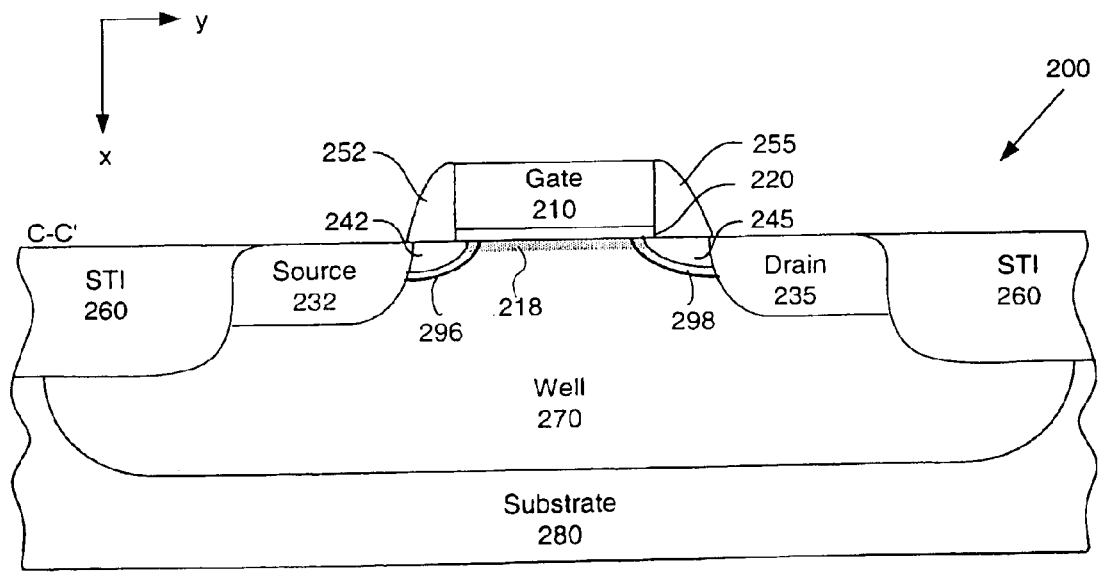

FIG. 3C illustrates a cross-sectional view of MOSFET 200 along line C–C' in FIG. 3A which extends along the "y" direction and across edge part 203 of MOSFET 200. As shown in FIGS. 3A and 3C, MOSFET 200 further comprises corner diffusion regions 292 and 296, which overlap with portions of source 232 and source/drain extension 242 in the edge parts 202 and 203, respectively, of MOSFET 200, and corner diffusion regions 294 and 298, which overlap with portions of drain 235 and source/drain extension 245 in edge parts 202 and 203, respectively, of MOSFET 200. Corner diffusion regions 292, 294, 296, and 298 include dopants having opposite conductivity type as those in the source, drain or source/drain extension regions, and serve to reduce the doping concentrations in the portions of the source, drain or source/drain extensions that overlap with the corner diffusion regions.

In one embodiment of the present invention, dopant concentration in corner diffusion region 292, 294, 296, or 298 is comparable to that in the source/drain extension regions 242 and 245; or, the difference between the dopant concentration in corner diffusion region 292, 294, 296, or 298 and that in the source/drain extension regions 242 and 245 is less than half an order of magnitude. Therefore, although corner diffusions may overlap with source and drain regions 232 and 235 to some extent, this overlapping is not shown in FIGS. 3B and 3C because, like the dopant concentration in the source/drain extension regions, dopant concentration in the corner diffusions are also much lighter than the dopant concentration in the source and drain regions 232 and 235.

FIGS. 3A–3C show that MOSFET 200 includes corner diffusion regions 292, 294, 296, and 298 on both the source and drain sides of gate 210 in the edge parts 202 and 203 of the MOSFET. In an alternative embodiment, MOSFET 200 only has corner diffusion regions 294 and 298 on the drain side of gate 210.

The lower dopant concentration in the portions of the drain and source/drain extension on the drain side of gate 210 due to added corner diffusion region(s) improves the integrity of the gate dielectric layer 220 by reducing the "hot-carrier effect" on the drain side of gate 210 in the edge part 202 or 203 of MOSFET 200. The lower dopant concentration in the portions of the source, drain, or one or both of source/drain extensions near gate 210 in the edge parts 202, 203 of MOSFET 200 also reduces the fringing electric field at the corners of STI 260, alleviating the edge or corner leakage problem associated with the formation of STI 260. Furthermore, since the corner diffusion regions 292, 294, 296, and 298 shown in FIGS. 3A and 3C extend further into the channel region under gate 210 than the source/drain extension regions in the edge part 202, 203 of MOSFET 200, they also help to alleviate the side-wall leakage problems associated with trapped electrons or negatively charged ions at the STI sidewalls when MOSFET 200 is a NMOSFET device, as explained below in connection with FIGS. 3D and 3E.

Figure 1A:
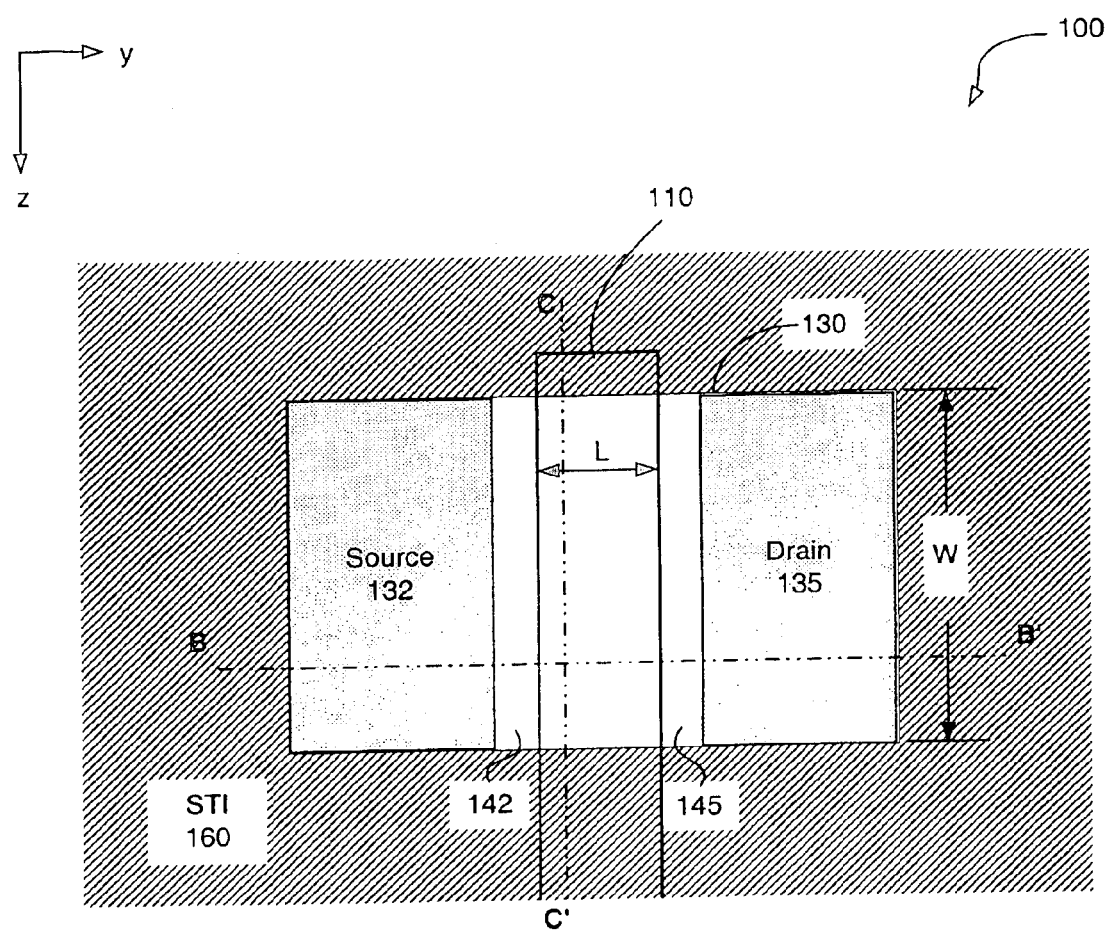
FIGS. 1A–1D are block diagrams illustrating top-down and cross-sectional views of a conventional MOSFET device.
Figure 1B:
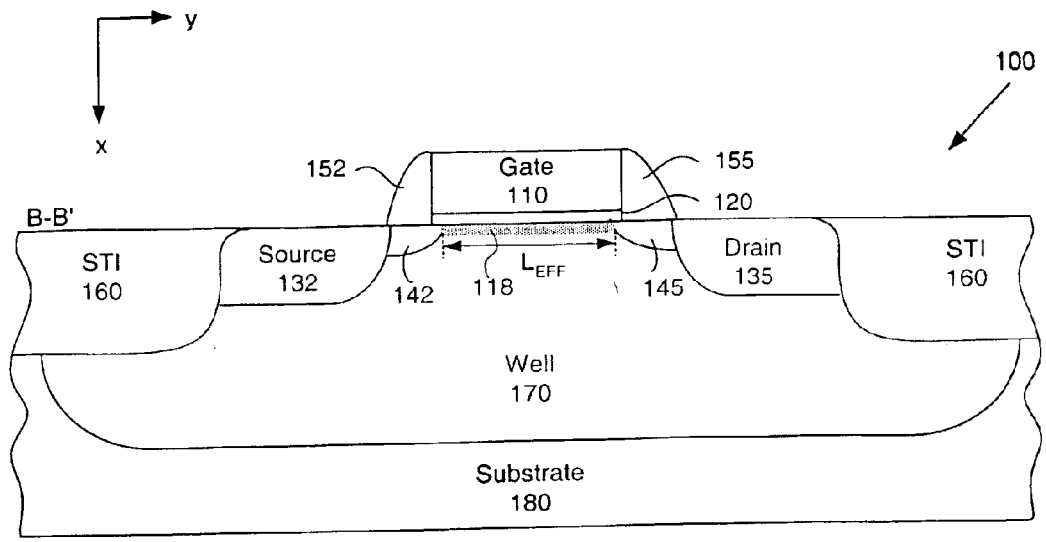
Figure 1C:
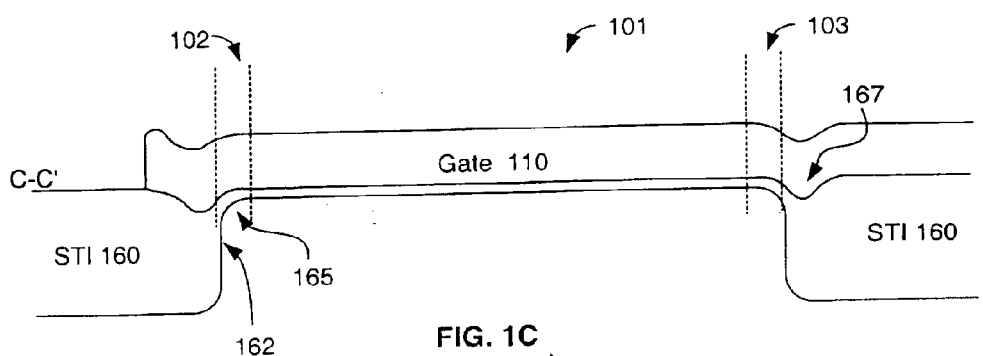
Figure 1D:
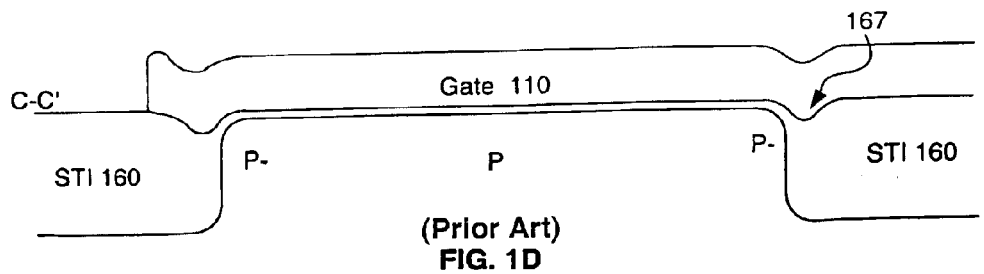
Figure 3D:
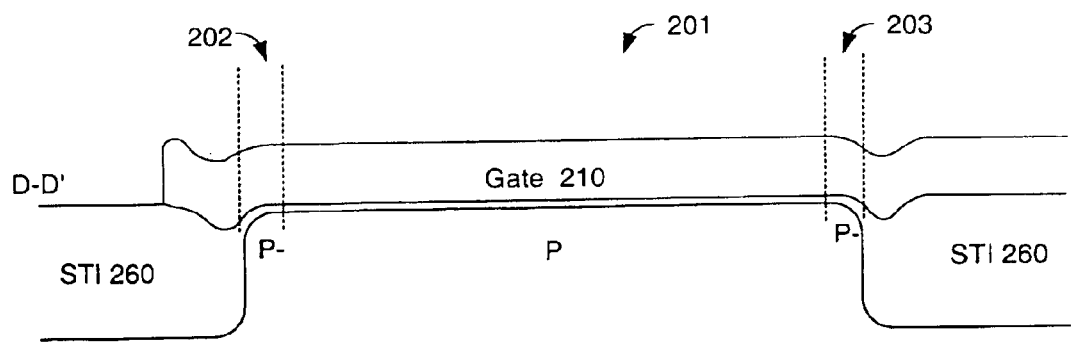
Figure 3E:
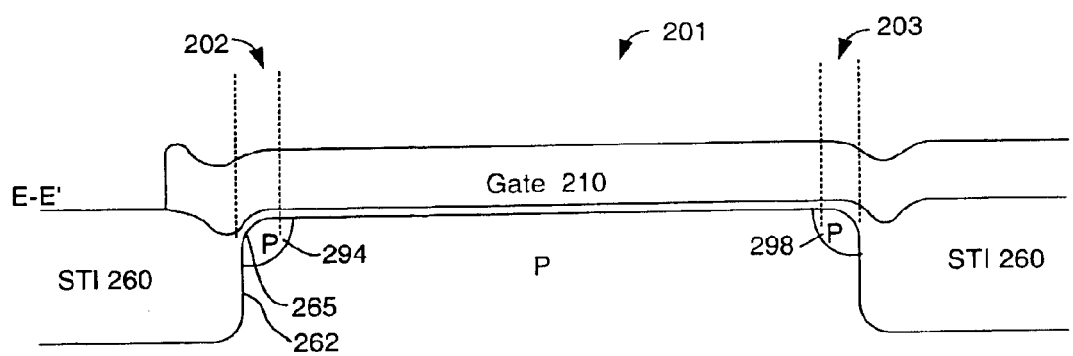

FIGS. 3D and 3E are cross-sectional views taken along lines D–D' and E–E' in FIG. 3A, respectively. Line D–D' and E–E' extend along the width or the "z" direction of NMOSFET 200 and across different parts of gate 210. The cross-sectional view along line D–D' as shown in FIG. 3D is similar to the corresponding cross-sectional view of conventional NMOSFET 100, as shown in FIG. 1D. The cross-sectional view along line E–E', which is closer to drain 235 than line D–D', shows corner diffusions 294 and 298 at STI sidewalls 262 and corners 265. The corner implants increase the P-type dopant concentrations in the corresponding part of well 270 under gate 210, making these portions of the channel 218 harder to be turned on and thus alleviating the side-wall leakage problem.

Figure 3F:
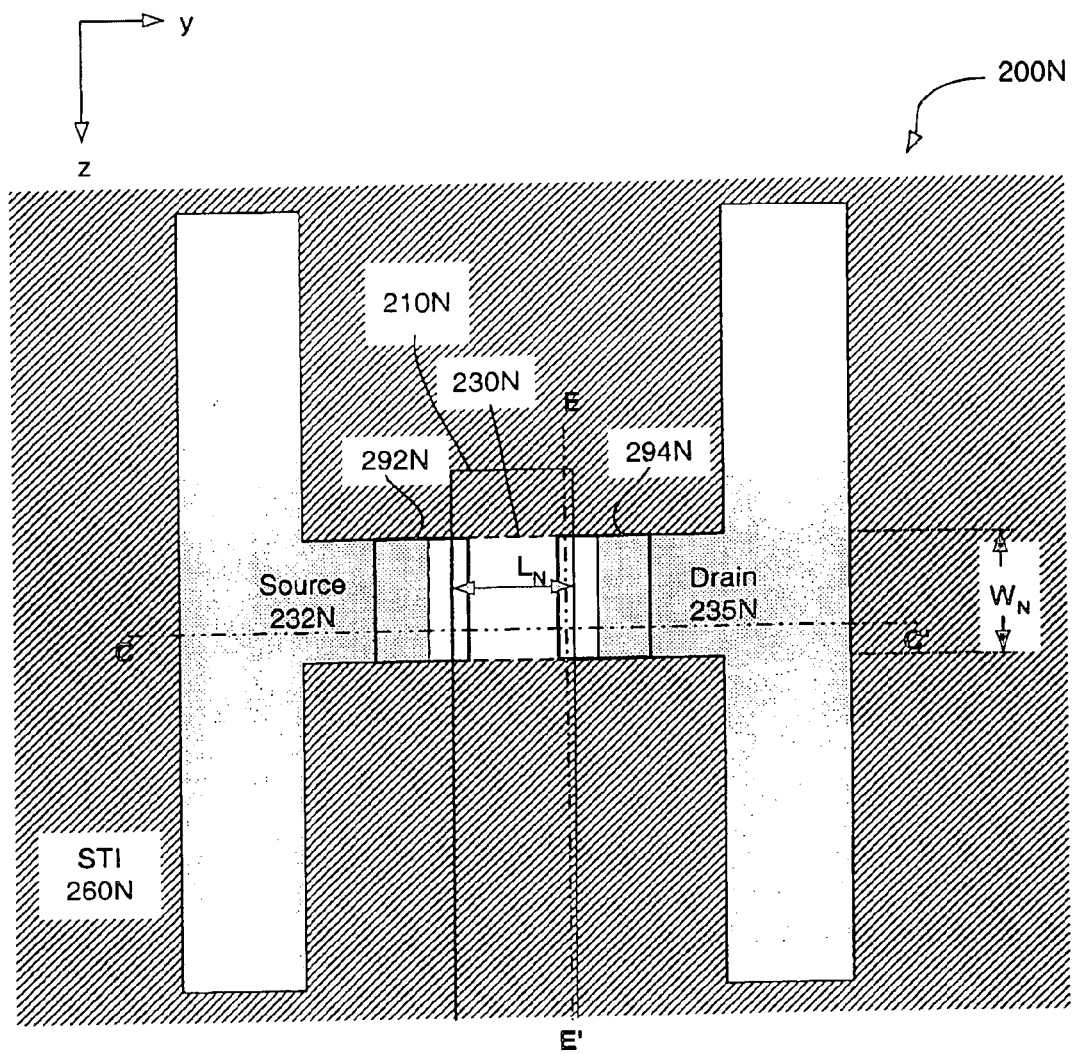
FIGS. 3F–3G are block diagrams illustrating top-down and cross-sectional views of a MOSFET device according to an alternative embodiment of the present invention.

In an alternative embodiment of the present invention, corner diffusion region 292, 294, 296, or 298 is not limited to edge part 202 or 203 of MOSFET 200 but may extend further into the middle part 201 of MOSFET 200 or along the entire width of MOSFET 200, especially when the width W of MOSFET 200 is narrow. FIG. 3F illustrates a top view of a narrow width MOSFET 200N, according to one embodiment of the present invention. MOSFET 200N comprises a gate 210N, a source 232N and a drain 235N in an active region 230N in a semiconductor substrate. Active region 230N may be bordered on some or all sides by isolation (or field) regions 260N formed using conventional shallow trench isolation (STI) techniques. The extent of gate 210N along the "y" direction shown in the FIG. 3F is called the length $L_N$ of the gate 210N, while the extent of the part of active region 230N near gate 210N along the z direction is called the width $W_N$ of MOSFET 210N. Width $W_N$ is usually much narrower than width W of MOSFET 200.

Figure 3G:
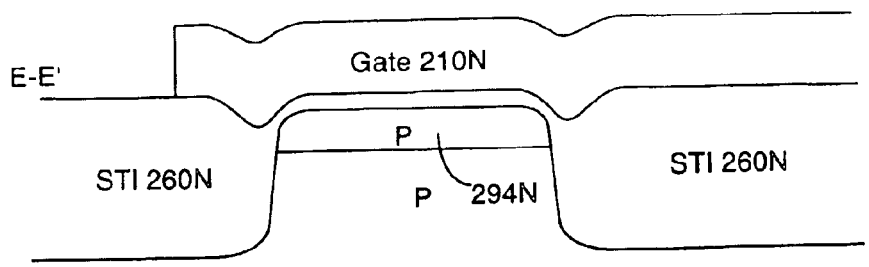

As shown in FIG. 3F, MOSFET 200N includes a corner diffusion region 294N on the drain side of gate 210N that extends along the entire width of MOSFET 200N. Corner diffusion region 294N is also shown in FIG. 3G, which illustrate a cross-sectional view of MOSFET 200N taken along line E–E' in FIG. 3F, for the case where MOSFET 200N is a NMOSFET. MOSFET 200N may further include another corner diffusion region 292N on the source side of gate 210N that extends along the entire width of MOSFET 200N.

Figure 7:
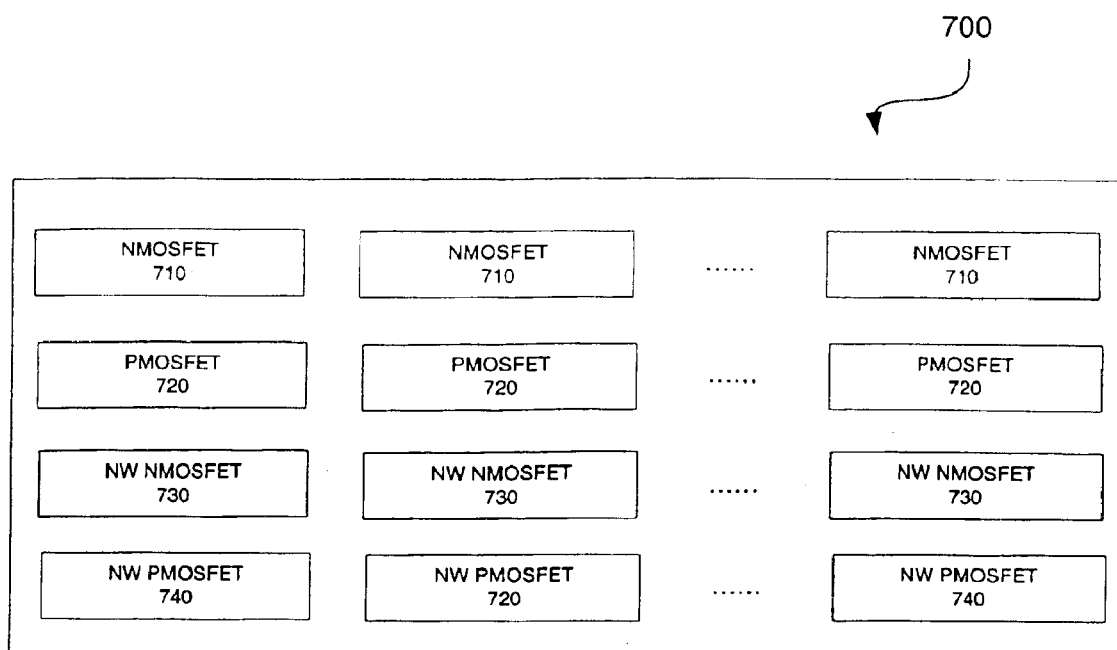
FIG. 7 is a block diagram illustrating various devices in an integrated circuit according to one embodiment of the present invention.

MOSFET 200 or 200N can be part of an IC 700 as shown in FIG. 7 that includes a plurality of NMOSFET devices 710, a plurality of PMOSFET devices 720, a plurality of narrow width NMOSFET devices (NW NMOSFET) 730, and a plurality of narrow width PMOSFET devices (NW PMOSFET) 740. In various embodiments of the invention, all of devices 710, 720, may include corner diffusion regions 292, 294, 296 or 298 or only some of devices 710, 720 may include such corner diffusion regions. Likewise, in various embodiments of the invention, all of devices 730, 740 may include corner diffusion regions similar to corner diffusion regions 292N or 294N or only some of devices 730, 740 may include such corner diffusion regions. Since the advantages of the invention are greater in NMOSFET devices than in PMOSFET devices and in narrow width devices than in conventional width devices, the percentage of devices 710, 720, 730, 740 using corner diffusion regions may also vary.

Figure 4A:
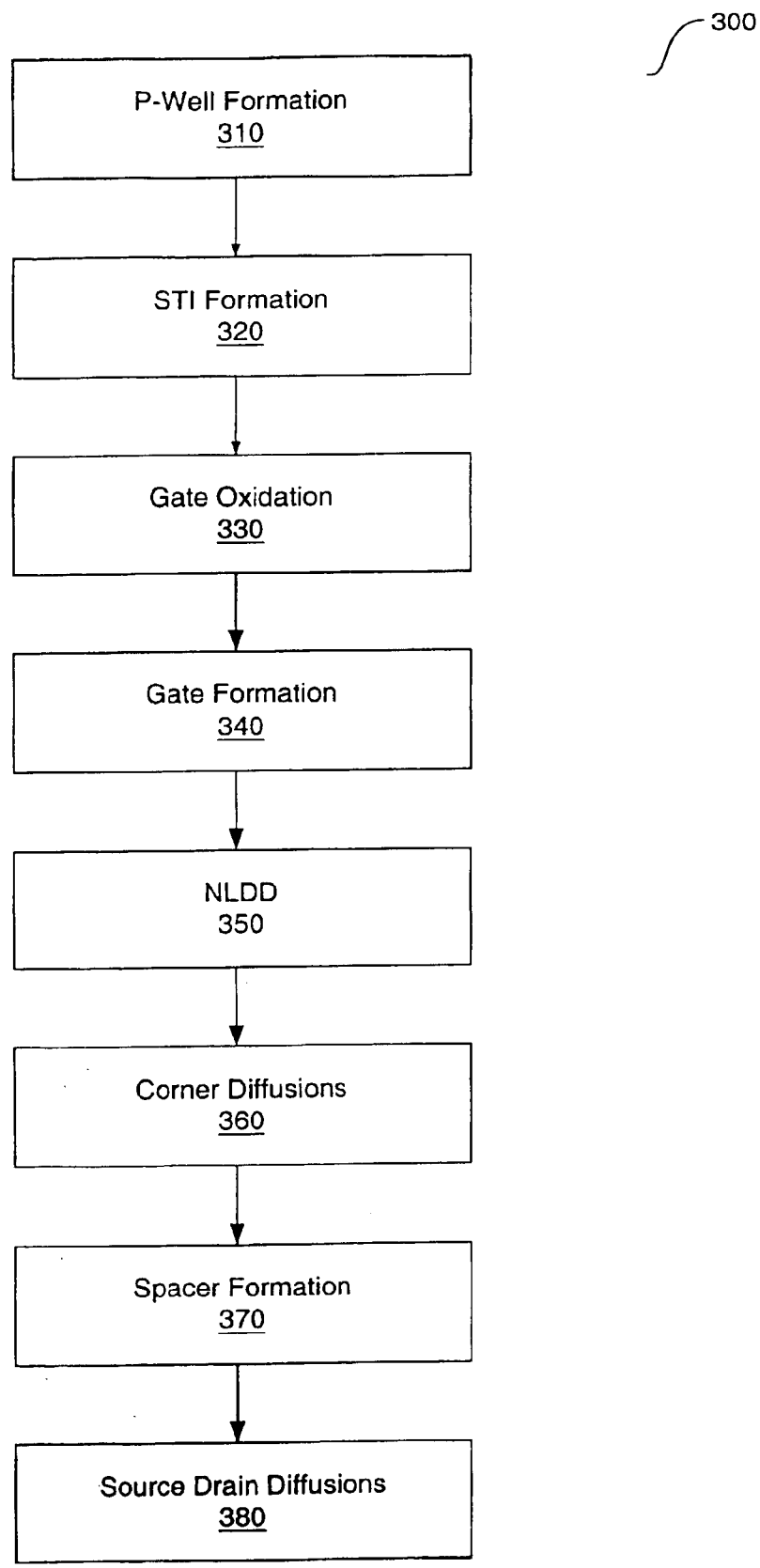
FIG. 4A is a flow chart illustrating part of a fabrication process for manufacturing a MOAFET device according to one embodiment of the present invention.

MOSFET 200 or 200N can be fabricated on a semiconductor substrate as part of a CMOS IC, which includes a plurality of NMOSFET and PMOSFET devices, using conventional CMOS fabrication processes with some modification of one or more masks applied on the substrate during one or more ion implantation steps. The following description in connection with FIG. 4A depicts a process 300 for fabricating MOSFET 200, when MOSFET 200 is a NMOSFET, according to one embodiment of the present invention. Those skilled in the art will recognize that, with slight modification, the description can be used to depict a process for fabricating MOSFET 200N or MOSFET 200 when it is a PMOSFET. As shown in FIG. 4A, process 300 comprises a P-well formation step 310, in which conventional IC fabrication processes associated with the formation of P-wells can be used to form well 270 and other P-wells in the CMOS IC including MOSFET 200. One of these IC fabrication processes is a P-well implant process, during which, a P-well mask typically made of photoresist is applied to the substrate exposing substrate areas corresponding to well 270 and other P-wells of the CMOS IC to energetic P-type dopant ions. Process 300 further comprises a STI step 320, in which conventional IC fabrication processes associated with the formation of STIs can be used to form STI regions 260 and other STIs in the CMOS IC including MOSFET 200. One of these fabrication processes is a trench etch process, during which a STI mask typically made of photoresist, silicon nitride, or silicon oxide is applied to the substrate exposing substrate areas corresponding to STI regions 260 to an etching plasma while covering active region 230.

Process 300 further comprises a gate oxidation step 330, in which conventional IC fabrication processes associated with the formation of gate oxide layers can be used to form gate oxide layer 220. Process 300 further comprises a gate formation step 340, in which, conventional IC fabrication processes associated with the formation of polysilicon gates can be used to form gate 210.

Process 300 further comprises a N-channel lightly doped drain (NLDD) step 350, in which conventional IC fabrication processes associated with the formation of NLDD regions can be used to form source/drain extensions 242 and 245 and other N-type source/drain extensions in the CMOS IC including MOSFET 200. One of these processes is a NLDD implant process, during which, a NLDD mask is applied to the substrate exposing substrate areas corresponding to source/drain extensions 242 and 245 and other N-type source/drain extensions in the CMOS IC to energetic N-type dopant ions.

Process 300 further comprises a process step 360 for forming corner diffusion regions 294, 298, 292, and/or 296 in MOSFET 200. In one embodiment of the present invention, in step 360, conventional IC fabrication processes associated with the formation of P-channel lightly doped drain (PLDD) regions elsewhere on the semiconductor substrate can be used to form P-type corner diffusions 294, 298, 292, and/or 296, simultaneously with the source/drain extensions in some or all of the PMOSFETs in the CMOS IC. One of these processes can be a PLDD implant process, during which a PLDD mask is applied to the substrate exposing selected substrate areas, including substrate areas corresponding to corner diffusions 292, 294, 296, or 298 and the source/drain extensions of some or all of the PMOSFET devices in the CMOS IC. Step 360 may be performed before or after or at the same time as step 350. For example, the PLDD implant process may be performed before or after the NLDD implant process; and after the NLDD and PLDD implant processes are performed, source/drain extensions 242 and 245, and corner diffusion regions 292, 294, 296, and/or 298 may be formed during the same diffusion process. Because P-type dopants usually have higher diffusivity than N-type dopants, in NMOSFET devices, corner diffusion regions formed this way usually extend deeper and wider into the substrate.

Figure 4B:
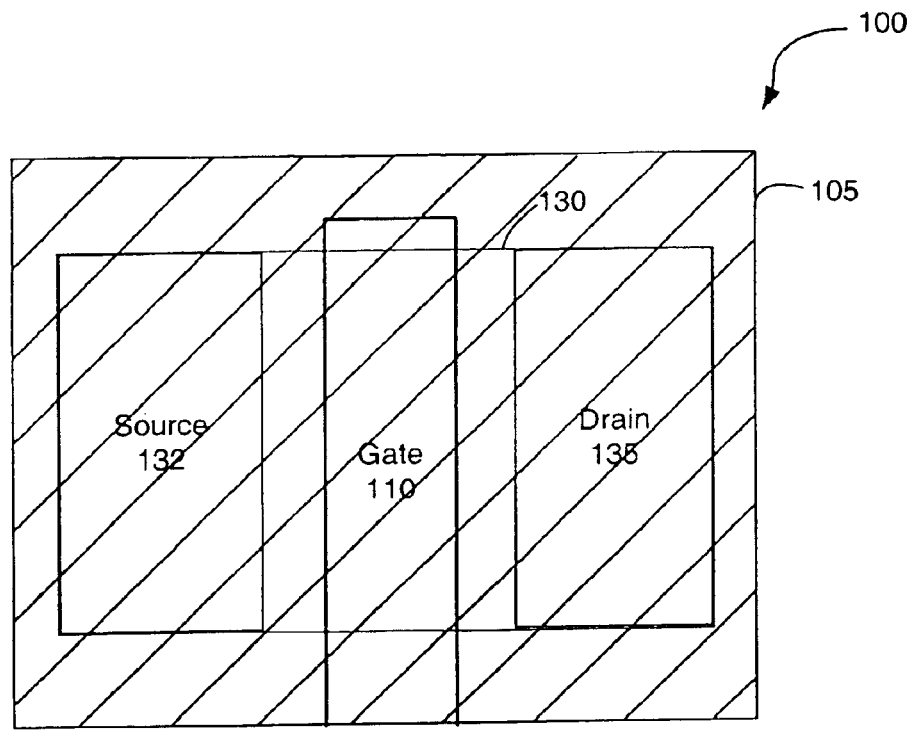
FIG. 4B is a block diagram illustrating a portion of a mask used during a process step for creating one or more diffusion regions in the conventional MOSFET.
Figure 4C:
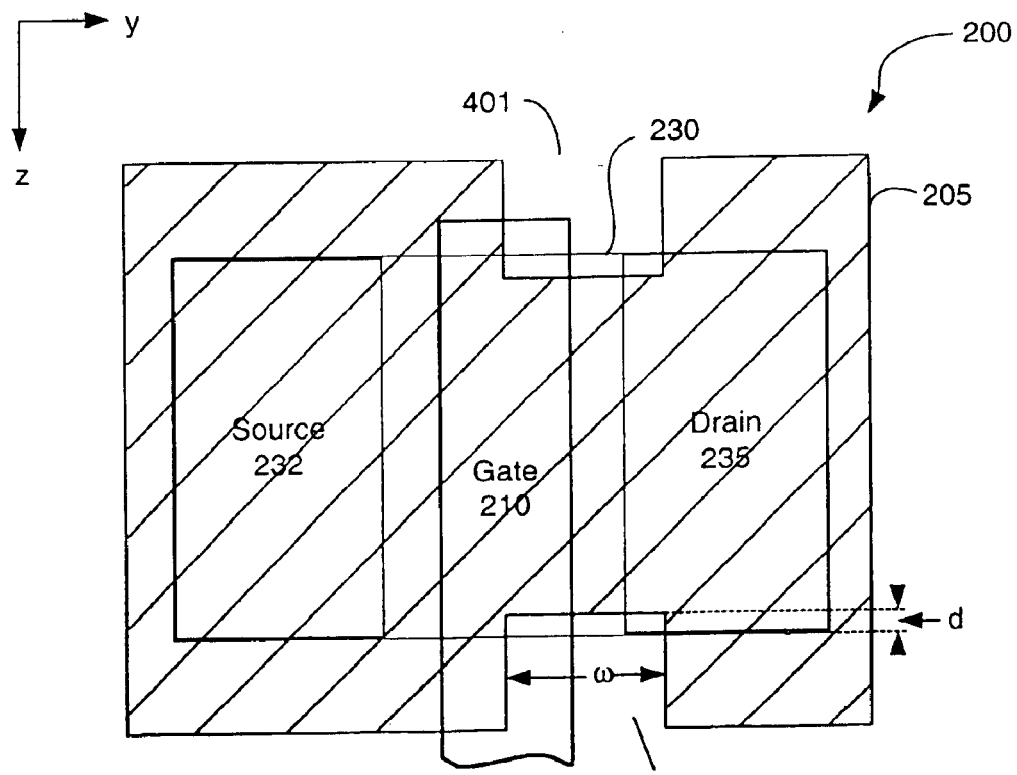
FIGS. 4C–4J are block diagrams illustrating a portion of a mask used during a process step for creating one or more diffusion regions in the MOSFET according to various embodiments of the present invention.
Figure 4D:
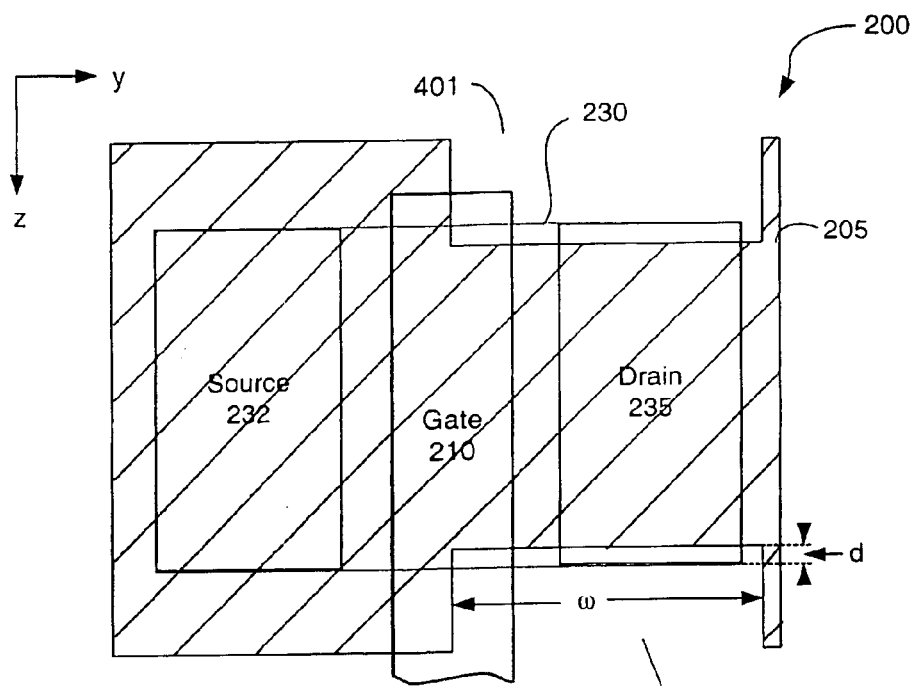
Figure 4E:
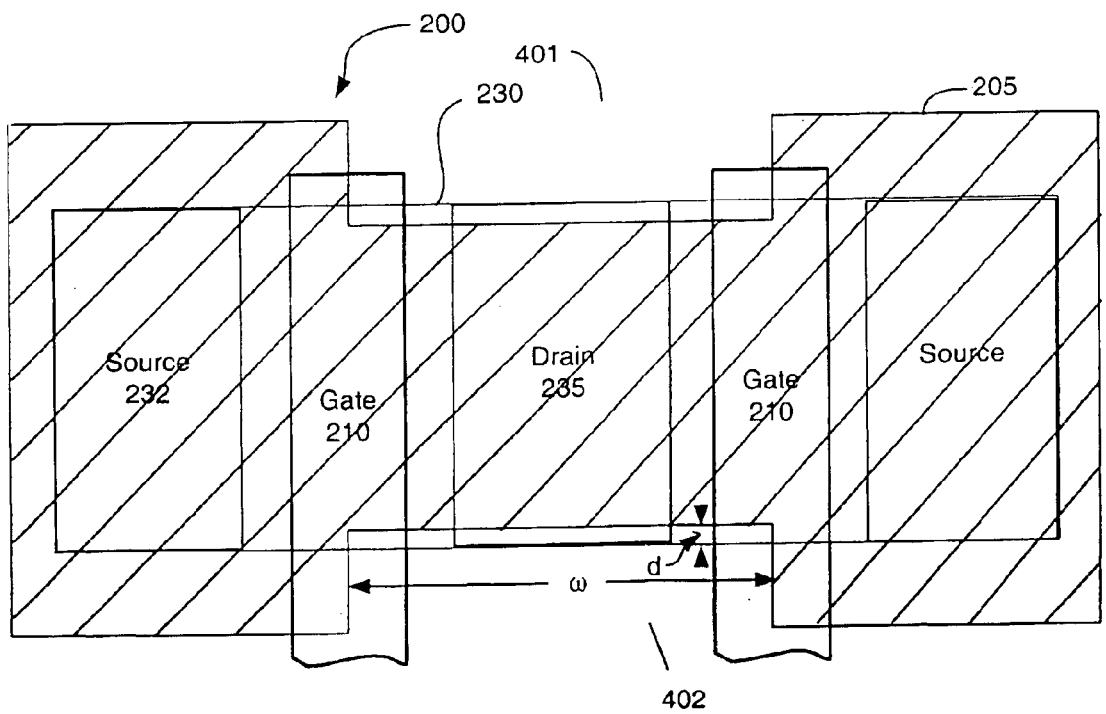
Figure 4F:
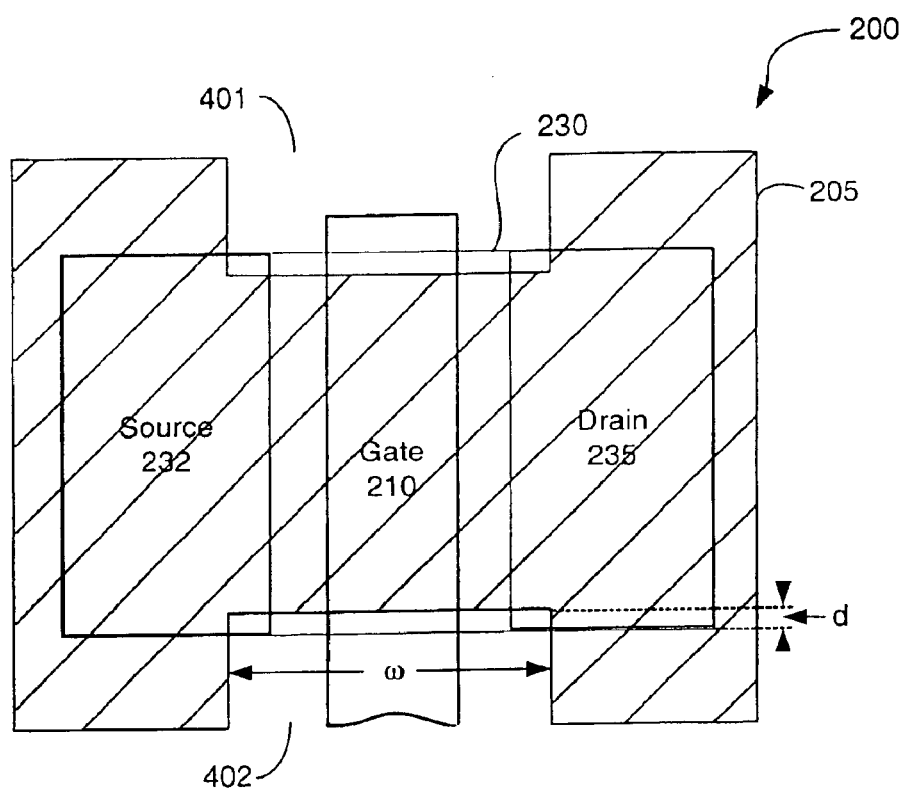
Figure 4G:
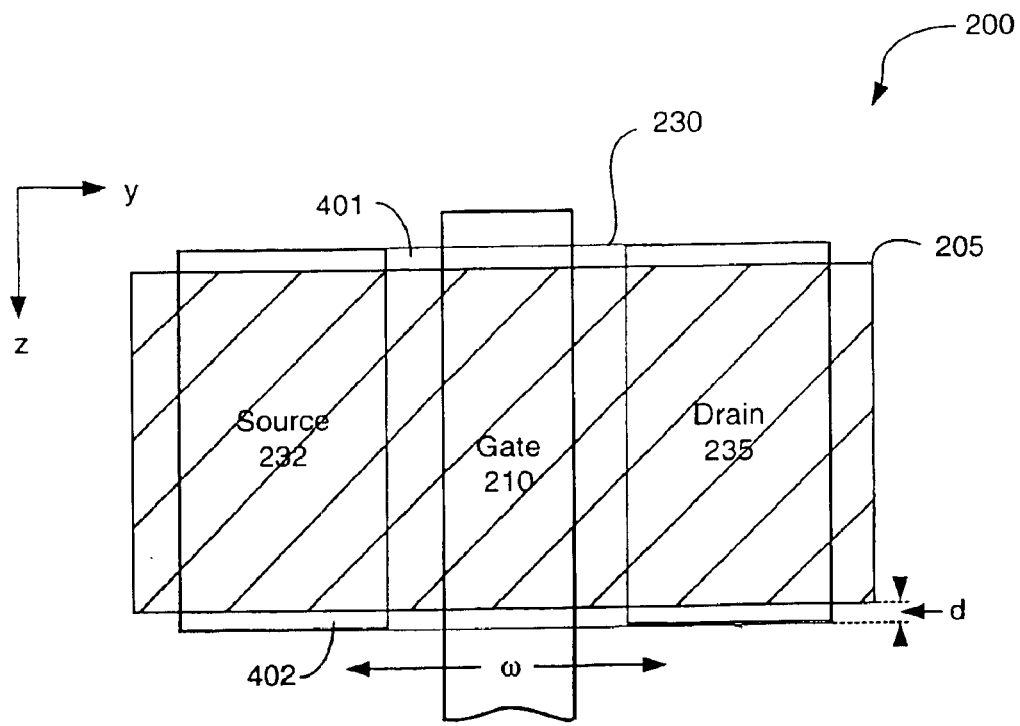

FIG. 4C illustrates the relationship of a portion of the PLDD mask 205 to NMOSFET 200 during the PLDD implant according to one embodiment of the present invention. As a comparison, FIG. 4B illustrates the relationship of a portion of a PLDD mask 105 to a NMOSFET 100 in the fabrication of a conventional CMOS IC. As shown in FIG. 4B mask 105 covers all of the active area 130 of the NMOSFET 100 during the PLDD implant process; but, as shown in FIG. 4C mask 205 has notches 401 and 402 to allow P-type dopant ions to be implanted in the part of active area 230 at the edges of NMOSFET 200 on the drain side of gate 110, in order to form corner diffusion regions 294 and 298. Notches 401 and 402 of mask 205 can be characterized by a width ω and depth d, as shown in FIG. 4C, representing the extent by which corner diffusion regions overlap with source 232, drain 235, and/or source/drain extensions 232 and 235. The notch width ω is generally not critical as long as it is large enough to account for alignment tolerances. For example, notch 401 and 402 can be made to extend all the way across drain 235 along the "y" direction, as shown in FIG. 4D, especially when MOSFET 200 is among a plurality of MOSFETs sharing one or more diffusion regions and a finger-shaped gate, as shown in FIG. 4E. When corner diffusions 292 and 296 are also included in MOSFET 200, notches 401 and 402 can be made to extend to the source side of gate 110, as shown in FIG. 4F. Notches 401 and 402 can also be made to extend all the way across the source and drain regions 232 and 235 along the "y" direction, as shown in FIG. 4G, especially when MOSFET 200 is among a plurality of MOSFETs sharing one or more diffusion regions and a finger-shaped gate. This way, alignment of mask 205 with gate 210 is not an issue during the formation of the corner diffusions.

Figure 4H:
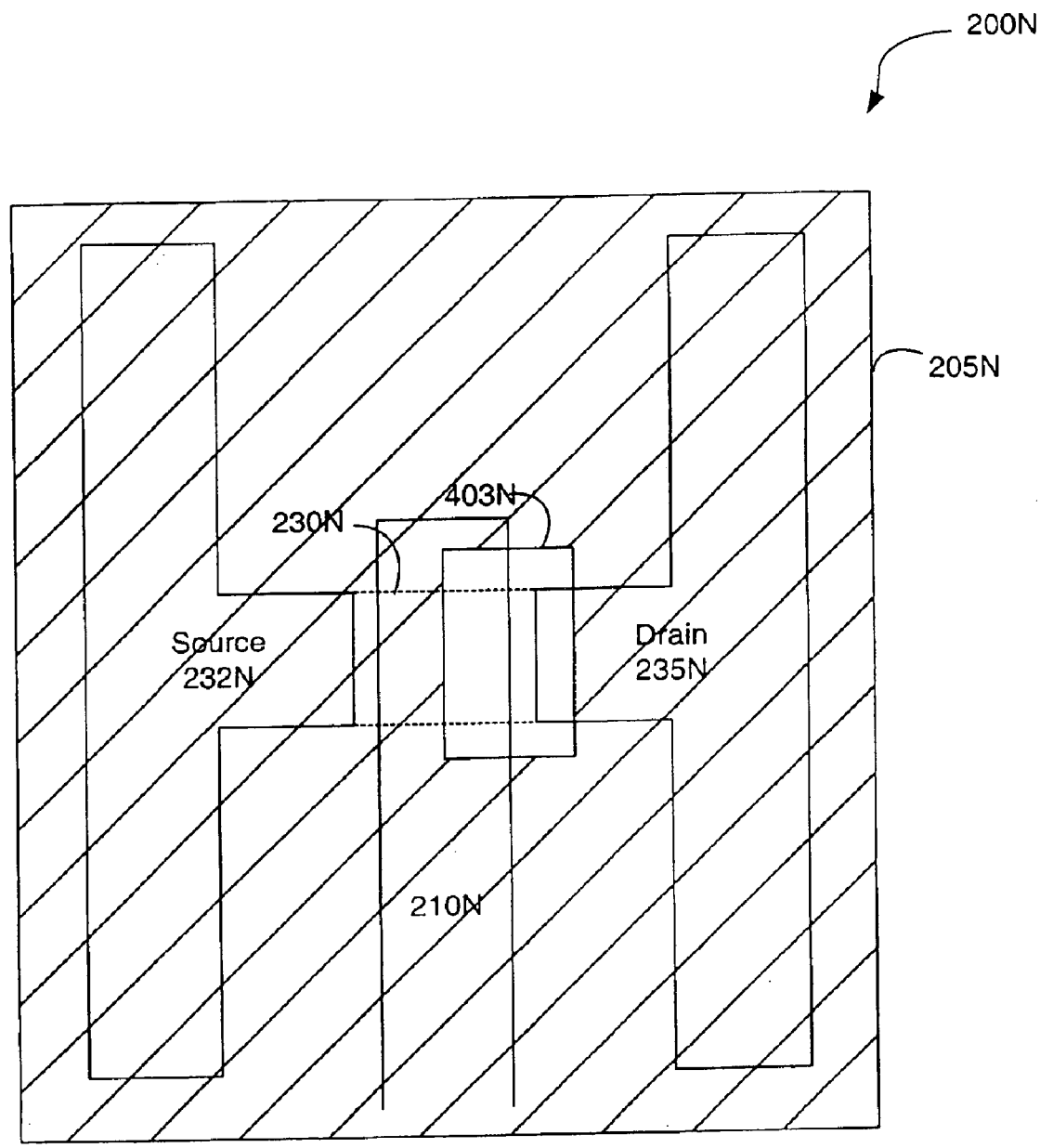
Figure 4I:
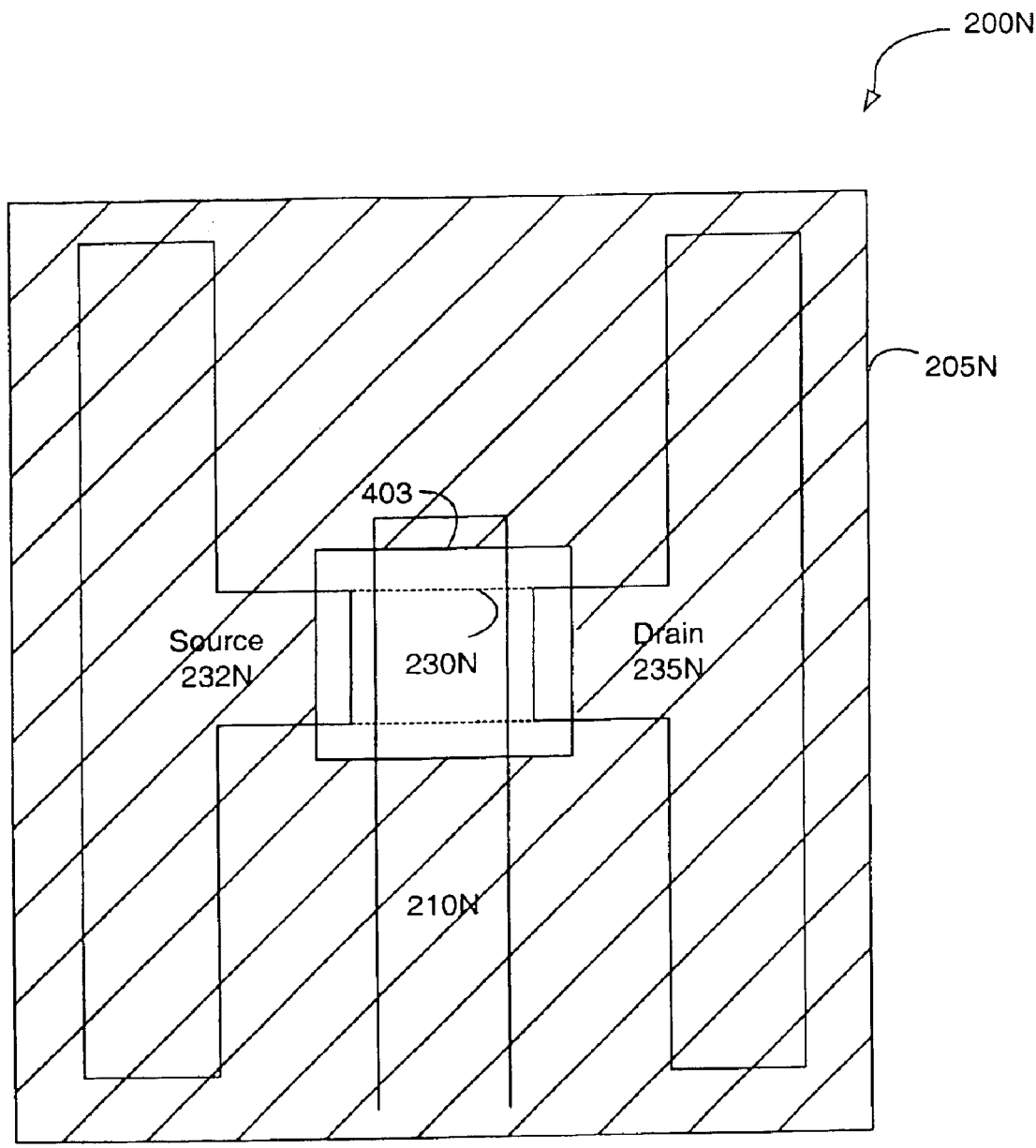
Figure 4J:
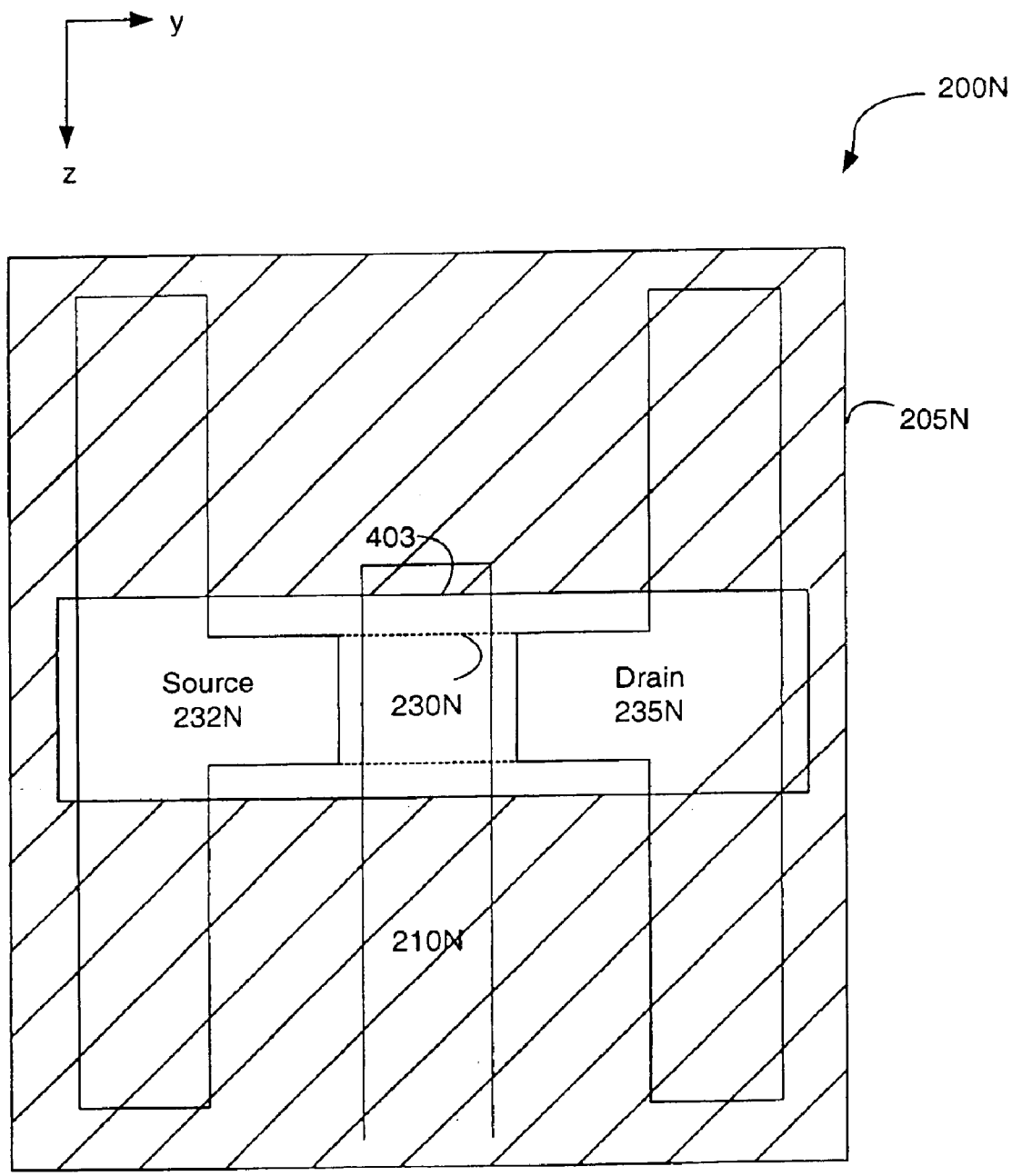

Mask 205 is shown in FIGS. 4C–4G to have notches 401 and 402 that expose edge portions of active area 230. Alternatively, notch 401 or 402 can be made to extend all the way across the width of MOSFET 200, especially when the width of MOSFET 200 is narrow. FIG. 4H shows a portion of a PLDD implant mask 205N on top of the narrow width NMOSFET device 200N. As shown in FIG. 4H, mask 205N includes an opening 403N for exposing NMOSFET 200N to a PLDD implant process. Opening 403N is situated on the drain side of gate 210N and extends all the way across the width of NMOSFET 200N. In an alternative embodiment of the present invention, opening 403N also extends to the source side of gate 210N, as shown in FIG. 4I. In yet another embodiment of the present invention, opening 403N may extend all the way across the source and drain regions 232N and 234N along the "y" direction, as shown in FIG. 4J.

Although FIGS. 4C–4J illustrate that the notches have a rectangular shape, it is noted that combinations of notches and notches having other shapes may be used in the PLDD or NLDD mask for creating the corner diffusions in accordance with the invention.

Process 300 of FIG. 4A further comprises spacer formation step 370, in which conventional IC fabrication processes associated with the formation of dielectric spacers are used to form spacers 242 and 245, together with the spacers of other MOSFET devices in the CMOS IC. Process 300 further comprises process step 380, in which conventional IC fabrication processes associated with the formation of N+ source/drain regions can be used to form source 232, drain 235, and other N+ sources and drains in the CMOS IC. One of these IC fabrication processes is a N+ source/drain implant process step, during which a N+ mask typically made of photoresist is applied to the substrate exposing substrate areas corresponding to source 232, drain 235, and other N+ source and drain regions of the CMOS IC.

Thus, by using a mask similar to mask 205 during the PLDD implant process, an NMOSFET of the present invention can be fabricated using a sequence of conventional fabrication processes for fabricating a CMOS IC. Therefore, without incurring extra manufacturing cost, the present invention achieves superior MOSFET performance, as described above and in more detail below. Similarly, when MOSFET 200 is a PMOSFET, it can be fabricated in accordance with the invention using a sequence of conventional fabrication processes for fabricating a CMOS IC and a mask similar to mask 205 during the NLDD implant process.

Although the corner diffusion regions in MOSFET 200 or 200N can be formed with LDD implants as discussed above, other implant processes that are different from the LDD implant process, may also be used to form the desired corner diffusion regions. For example, the N-type corner diffusions in a PMOSFET can be formed using an implant process different from the NLDD implant process so that the N-type dopants can be injected more deeply into the substrate than conventional NLDD implant process. Thus, the N-type corner diffusion regions in the PMOSFET would extend deeper into the substrate than the P-type source/drain extension regions.

The present invention allows further increase in circuit density by appropriately using additional localized doping in the corner diffusion regions in a MOSFET to address the increased likelihood of leakage problems. When the corner diffusions are limited to the edge parts of the MOSFET, they do not adversely affect the threshold voltage levels in the main part of the MOSFET. But after the corner diffusion regions 292, 294, 296, and/or 298 are added, the edge parts 202, 203 of the MOSFET 200 may have a higher threshold voltage as compared to that in the main part 201 of the MOSFET. The higher threshold voltage in the edge parts 202, 203 results in reduced likelihood of leakage at the edge of MOSFET 200. Increasing threshold voltage only in the edge parts of a MOSFET has the advantage of lower power consumption and lower heat generation.

Figure 5A:
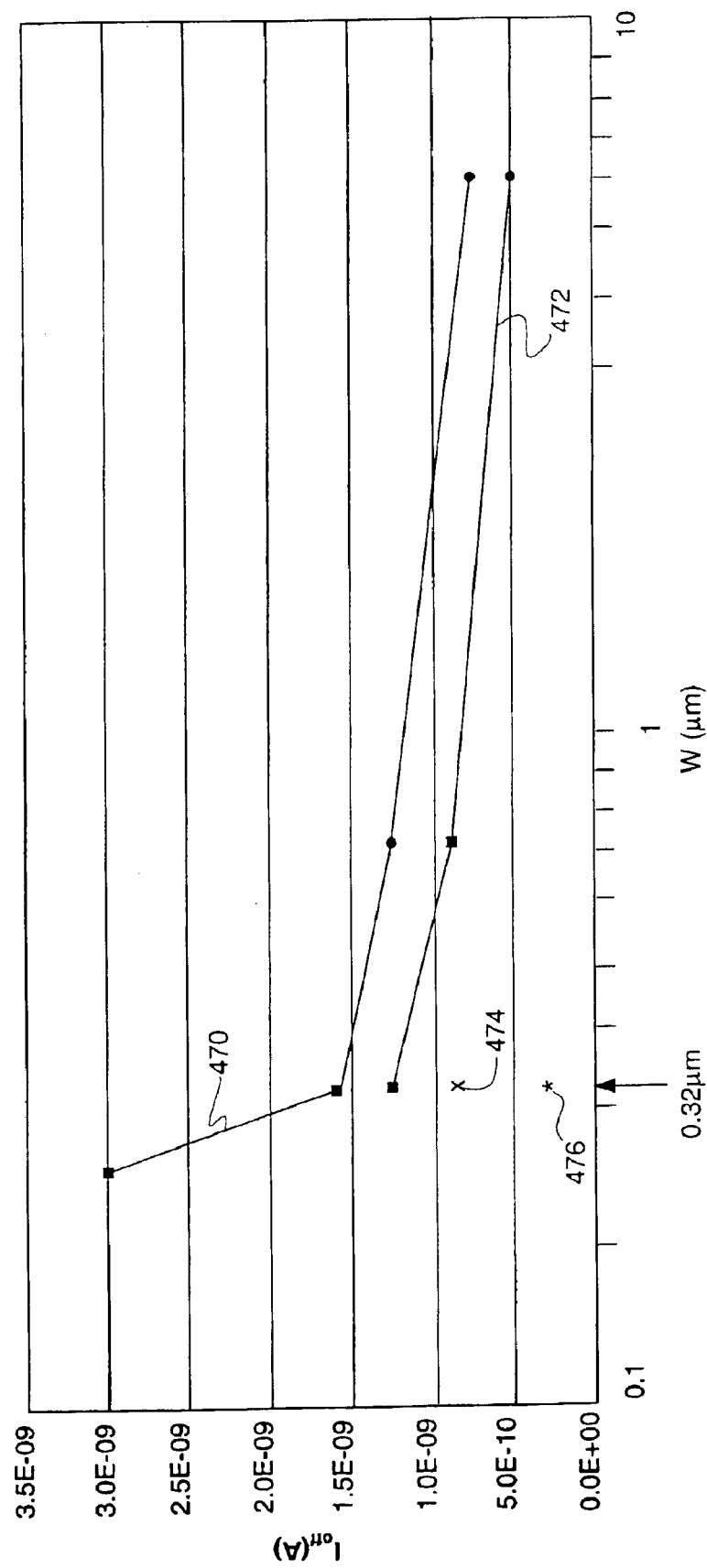
FIGS. 5A and 5B are charts depicting representative performance characteristics of the MOSFET in accordance with the present invention as compared with performance characteristics of the conventional MOSFET.

As stated above, the corner diffusions are created using notches 401, 402, and/or 403N in an ion implant mask, and notches 401 and 402 are characterized by width $\omega$ and depth d, as shown in FIGS. 4C–4G, representing the extent by which corner diffusion regions 292, 294, 296, and/or 298 overlap with source 232, drain 235, and source/drain extensions 232 and 235. While notch width $\omega$ is generally not critical as long as it is large enough to account for alignment tolerances, an increase in notch depth d usually results in better $I_{off}$ performance of MOSFET 200. FIG. 5A illustrates the effect of notch depth d of mask 205 on the $I_{off}$ from source to drain in MOSFET 200. FIG. 5A includes curves, 470 and 472, representing $I_{off}$ versus W of MOSFET 200 for two different notch depths, d=0 (representing the prior art situation) and d=0.065 $\mu$m, respectively. As shown, the amount of $I_{off}$ for any device width is significantly reduced by increasing the notch depth d from 0 to 0.065 $\mu$m. Further reduction in the amount of $I_{off}$ can be achieved by further increase in the notch depth, as shown by representative data point 474 for a channel width of 0.32 $\mu$m when the notch depth is 0.095 $\mu$m. Data point 476 in FIG. 5A depicts a relative improvement for a "full-opening" situation (i.e., d=W/2), such as the situations shown in FIGS. 4H–4J, for a channel width W of 0.32 $\mu$m. Enhanced $I_{off}$ performance can also occur for other channel widths as well. As discussed earlier, curves 470 and 472 also reflect the INWE, i.e., the increase of $I_{off}$ as the MOSFET width narrows.

Figure 5B:
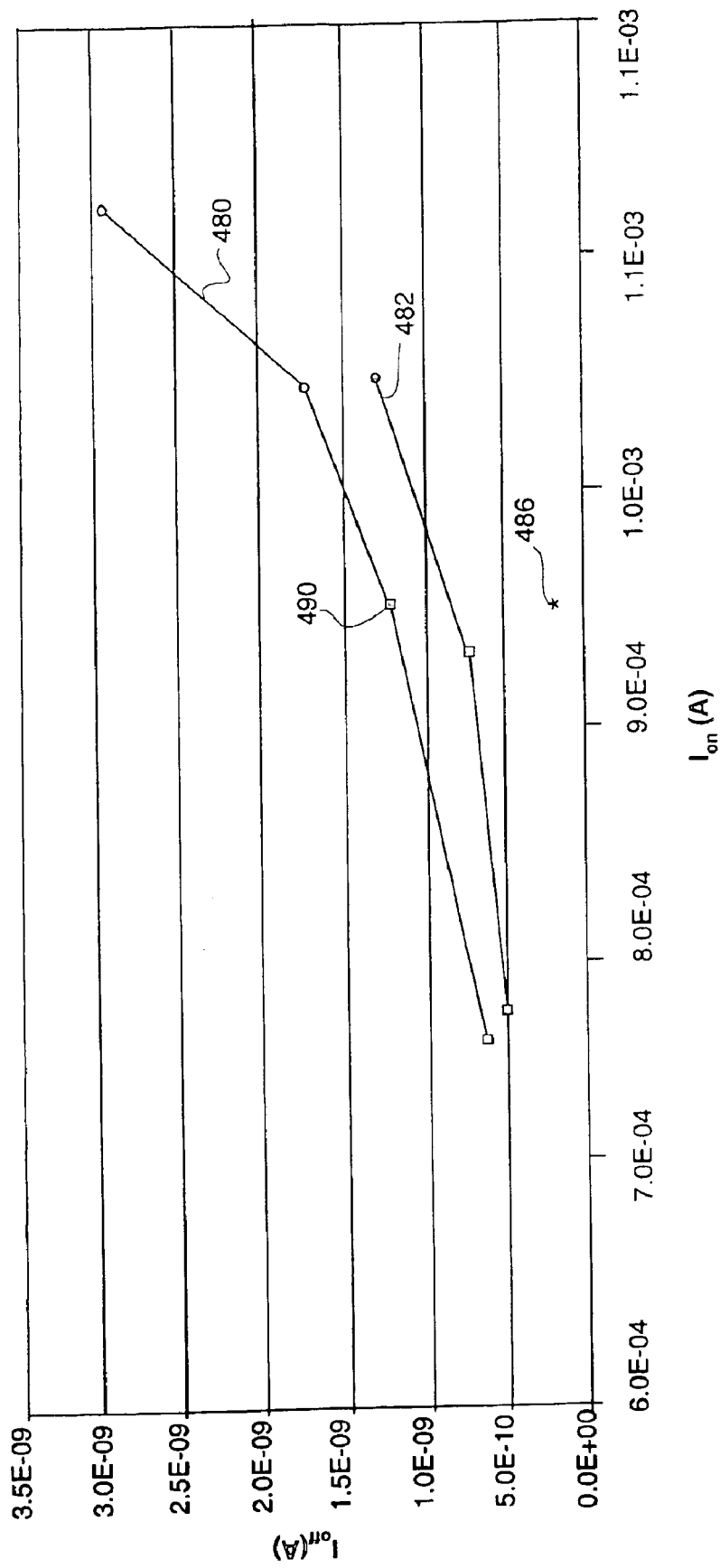

The reduction of $I_{off}$ results in an improved $I_{on}/I_{off}$ ratio. As noted, the transistor on/off ratio ($I_{on}/I_{off}$) is a common figure of merit and benchmark for transistor performance comparisons. Typically, $I_{off}$ increases as $I_{on}$ increases, as shown in FIG. 5B, which includes two $I_{off}$ versus $I_{on}$ curves, 480 and 482. Curve 480, which includes data point 490, depicts a typical $I_{off}$ versus $I_{on}$ curve of a prior art MOSFET, such as MOSFET 100. Curve 482 depicts an $I_{off}$ versus $I_{on}$ curve of MOSFET 200, made using mask 205 with a notch depth of 0.065 $\mu$m. As depicted, MOSFET 200 has significantly improved on/off ratios as compared with MOSFET 100. Data point 486 corresponds to the full-opening configuration (i.e., d=W/2)), such as the situations shown in FIGS. 4H–4J, where for the same $I_{on}$, $I_{off}$ is reduced by greater than 80%, a five times increase in $I_{on}/I_{off}$, as compared to data point 490.

Figure 6A:
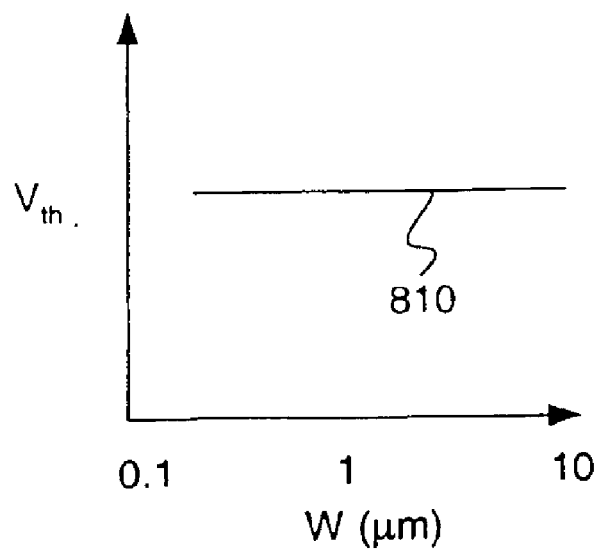
FIGS. 6A and 6B are plots illustrating reduced INWE of the MOSFET according to one embodiment of the present invention.
Figure 6B:
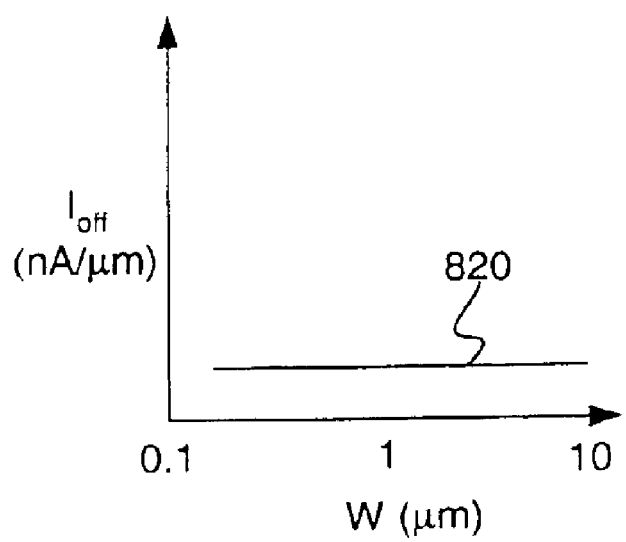

The improved performance of MOSFET 200 of the present invention is also reflected by its reduced INWE as compared with prior art MOSFET 100. FIG. 6A shows a curve 810 representing the threshold voltage vs. device width for a MOSFET 200 made in accordance with one embodiment of the present invention, and FIG. 6B shows a curve 820 representing $I_{off}$ vs. device width for a MOSFET 200 made in accordance with one embodiment of the present invention. By adjusting the notch depth d and the dopant concentrations in corner diffusion regions 292, 294, 296 and 298, the narrow width effect can be offset to a desired level.

It is noted that while curves 810 and 820 are shown somewhat flat for any channel width, indicating almost complete elimination of the INWE, as shown in FIGS. 2A and 2C, the present invention is not limited to complete elimination of the INWE. The slope corresponding to segment 50 in FIG. 2A and segment 70 in FIG. 2C can be reduced to the levels desired, by adjusting the notch depth d and the dopant concentrations in corner diffusion regions 292, 294, 296 and 298 in accordance with the present invention.

Although the present invention has been described in detail, it should be understood that various changes, substitutions, and alterations can be made hereto without departing from the spirit and scope of the invention as defined by the appended claims.

We claim:

1. A method for fabricating a device on a substrate, comprising:
    forming first and second isolation regions in said substrate, said first isolation region bordering a first side of an active area of the device and said second isolation region bordering a second side of said active area opposite said first side;
    forming a gate over said substrate, said gate extending between said first and second sides of said active area;
    forming a source/drain extension region in said substrate on each side of said gate, said source/drain extension regions extending between said first and second sides of the active area and including dopants of a first conductivity type;
    forming first and second corner diffusion regions in said substrate, said corner diffusion regions including dopants of a second conductivity type that is opposite to said first conductivity type and overlapping with a first source/drain extension region in areas of said substrate adjacent said first and second isolation regions; and
    forming source and drain diffusion regions in said substrate adjacent said source/drain extension regions on opposite sides of said gate and extending between said first and second sides of said active area, said source and drain diffusion regions being further away from said gate than said source/drain extension regions and including dopants of said first conductivity type.

2. The method of claim 1 wherein forming corner diffusion regions comprises applying a mask on said substrate that exposes at least a portion of said active area near said gate.

3. The method of claim 2 wherein said exposed portion of said active area is near at least one of said isolation regions.

4. The method of claim 1 wherein said device is fabricated on said substrate together with a plurality of other devices and wherein said corner diffusion regions are formed during a sequence of processes for forming source/drain extensions in some of said plurality of other devices.

5. The method of claim 1, wherein said device is a PMOSFET device, wherein said source/drain extensions are formed using a PLDD implant process, and wherein said corner diffusion regions are formed using a NLDD implant process.

6. The method of claim 1, wherein said device is a NMOSFET device, wherein said source/drain extensions are formed using a NLDD implant process, and wherein said corner diffusion regions are formed using a PLDD implant process.

7. The method of claim 1 wherein said corner diffusion regions are formed such that an on/off ratio of said device is determined by an extent said corner diffusion regions overlap with said first source/drain extension region.

8. The method of claim 1 wherein said corner diffusion regions are formed such that a leakage current of said device is determined by an extent said corner diffusion regions overlap with said source/drain extension region.

9. The method of claim 1 wherein each of said corner diffusion regions occupies an edge portion of said active area adjacent one of said isolation regions and extends from a surface of said substrate to a depth in said substrate that is close to a depth of the source/drain extension region.

10. The method of claim 1 wherein said corner diffusion region extends under said gate.

11. The method of claim 1 wherein a concentration of said dopants of said second conductivity type in said corner diffusion regions is comparable to a concentration of said dopants of said first conductivity type in said source/drain extension region.

12. The method of claim 1, further comprising:
    third and fourth corner diffusion regions in said substrate, said third and fourth corner diffusion regions overlapping with a second source/drain extension region in areas of said substrate adjacent said first and second isolation regions: and
    wherein said second source/drain extension region includes dopants of a first conductivity type and said third and fourth corner diffusion regions include dopants of a second conductivity type that is opposite to said first conductivity type.

13. The method of claim 1 wherein the device further comprises a gate dielectric layer under said gate, and wherein said corner diffusion regions are formed to reduce hot-carrier effects on said gate dielectric film.

14. The method of claim 1 wherein said first and second isolation regions have divots near said active area and said corner diffusion regions are formed to reduce leakage current in said device associated with said divots.

15. The method of claim 1 wherein said first and second isolation regions have sidewalls bordering said active area and said corner diffuison regions are formed to reduce leakage current near said sidewalls.

16. The method of claim 1 wherein said corner diffusion regions overlap with said drain diffusion region in areas adjacent said first and second isolation regions.

17. A method for fabricating a device on a substrate, comprising:
    forming isolation regions in said substrate, said isolation regions defining an active area of the device and bordering at least two opposite sides of said active area;
    forming a gate over said substrate and extending between said two opposite sides of said active area;
    forming a first diffusion region and a second diffusion region in said substrate on opposite sides of said gate and extending between said two opposite sides of said active area;
    forming a third diffusion region in said substrate between said gate and said first diffusion region and extending between said two opposite sides of said active area; and
    forming a fourth diffusion region in said substrate between said gate and said second diffusion region and extending between said two opposite sides of said active area, said fourth diffusion region including two edge portions adjacent respective ones of said isolation regions and a middle portion between said two edge portions, wherein said two edge portions are doped with dopants of a first conductivity type and with dopants of a second conductivity type in comparable concentrations, said first conductivity type being opposite to said second conductivity type, and said middle portion is doped primarily with dopants of a first conductivity type.

18. The method of claim 17 wherein said two edge portions and said middle portion of said fourth diffusion region extend from a surface of said substrate to a depth in said substrate.

19. The method of claim 17 wherein size of each of said two edge portions relative to that of said middle portion of said fourth diffusion region determines an on/off ratio of said device.

20. The method of claim 17 wherein size of each of said two edge portions relative to that of said middle portion determines a leakage current of said device.

21. The method of claim 17 wherein the device further comprises a gate dielectric layer under said gate, and wherein said dopants of said second conductivity type in said two edge portions of said fourth diffusion region serve to reduce hot-carrier effects on said gate.

22. The method of claim 17 wherein the device is among a plurality of transistors in an integrated circuit and said dopants of said conductivity type were introduced into said substrate by exposing portions of said substrate corresponding to said two edge portions of said fourth diffusion region to an implant process for forming source/drain extension regions in some of said plurality of transistors.

23. A method for fabricating a device on a substrate, comprising:
    forming isolation regions in said substrate, including a first isolation region bordering a first side of an active area of the device and a second isolation region bordering a second side of said active area opposite to said first side;
    forming a gate over said substrate and extending between said first and second sides of said active area;
    forming a first diffusion region and a second diffusion region on opposite sides of said gate and extending between said first and second sides of said active area;
    forming a third diffusion and a fourth diffusion region between said gate and respective ones of said first diffusion region and said second diffusion region, said third diffusion region and said fourth diffusion region extending between said first and second sides of said active area and from a surface of said substrate to a first depth in said substrate; and
    forming a firth diffusion region overlapping with said fourth diffusion region in an area of said substrate adjacent said first isolation region and a sixth diffusion region overlapping with said fourth diffusion region in an area of said substrate adjacent said second isolation region, said fifth diffusion region and said sixth diffusion region extending from a surface of said substrate to a second depth in said substrate, said second depth being close to said first depth; and
    wherein said fourth diffusion region is doped with dopants of a first conductivity type and each of said fifth diffusion region and said sixth diffusion region is doped with dopants of a second conductivity type opposite to said first conductivity type, and wherein concentration of dopants of said second conductivity type in said fifth and sixth diffusion regions is comparable with concentration of dopants of said first conductivity type in said fourth diffusion region.

24. The method of claim 23, further comprising:
    forming a seventh diffusion region and an eighth diffusion region overlapping with said third diffusion region in areas of said substrate adjacent said first and second isolation regions and extending from a surface of said substrate to said second depth in said substrate, wherein said third diffusion region is doped with dopants of said first conductivity type and each of said seventh diffusion region and said eighth diffusion region is doped with dopants of said second conductivity type opposite to said first conductivity type, and wherein concentration of dopants of said second conductivity type in said seventh and eighth diffusion regions is comparable with concentration of dopants of said first conductivity type in said third diffusion region.

25. The method of claim 23 wherein said fifth diffusion region and said sixth diffusion region overlap with respective portions of said second diffusion region adjacent said first and second isolation regions.

26. A method for forming a substrate, comprising:
    forming a gate over said substrate and extending across a width of said device;
    forming a first diffusion region and a second diffusion region on opposite sides of said gate and extending across said width of said device;
    forming a third diffusion and a fourth diffusion region between said gate and respective ones of said first diffusion region and said second diffusion region, said third diffusion region and said fourth diffusion region extending across said width of said device and from a surface of said substrate to a first depth in said substrate; and
    forming a fifth diffusion region overlapping with said fourth diffusion region and extending across said width of said device and from a surface of said substrate to a second depth in said substrate, said second depth being close to said first depth; and
    wherein said fourth diffusion region and said fifth diffusion region are doped with dopants of opposite conductivity types in comparable concentrations.

27. The method of claim 26, further comprising:
    a sixth diffusion region overlapping with said third diffusion region and extending across said width of said device and from a surface of said substrate to said second depth in said substrate, wherein said third diffusion region and sixth diffusion region are doped with dopants of opposite conductivity types in comparable concentrations.

28. The method of claim 26 wherein said device is a narrow width device.

29. The method of claim 26 wherein said fifth diffusion region is formed to reduce an inverse narrow width effect associated with said device.

30. The method of claim 26 wherein said fourth diffusion region and said fifth diffusion region extend between two shallow trench isolation regions formed in said substrate that define said width of said device, and said fifth diffusion region is formed to reduce leakage current in said device associated with said shallow trench isolation regions.

* * * * *